United States Patent
Onitsuka et al.

(10) Patent No.: US 8,400,050 B2
(45) Date of Patent: Mar. 19, 2013

(54) PIEZOELECTRIC VIBRATOR HAVING A RESTRICTION PORTION FOR RESTRICTING SCATTERING OF A GETTER MATERIAL, OSCILLATOR, ELECTRONIC EQUIPMENT AND RADIO-CONTROLLED TIMEPIECE

(75) Inventors: Osamu Onitsuka, Chiba (JP); Junya Fukuda, Chiba (JP); Kazuyoshi Sugama, Chiba (JP)

(73) Assignee: Seiko Instruments Inc., Chiba (JP)

( * ) Notice: Subject to any disclaimer, the term of this patent is extended or adjusted under 35 U.S.C. 154(b) by 149 days.

(21) Appl. No.: 13/035,408

(22) Filed: Feb. 25, 2011

(65) Prior Publication Data

US 2011/0164473 A1 Jul. 7, 2011

Related U.S. Application Data

(63) Continuation of application No. PCT/JP2008/065246, filed on Aug. 27, 2008.

(51) Int. Cl.
*H01L 41/08* (2006.01)
*H03H 9/19* (2006.01)

(52) U.S. Cl. .......................................... 310/370
(58) Field of Classification Search ................... 310/370, 310/344

See application file for complete search history.

(56) References Cited

U.S. PATENT DOCUMENTS

| | | | |
|---|---|---|---|
| 7,439,658 B2 * | 10/2008 | Aratake | 310/344 |
| 8,087,135 B2 * | 1/2012 | Ouchi et al. | 29/25.35 |
| 8,151,640 B1 * | 4/2012 | Kubena | 73/504.04 |
| 8,179,021 B2 * | 5/2012 | Fukuda | 310/344 |
| 8,212,454 B2 * | 7/2012 | Onitsuka et al. | 310/348 |
| 2011/0140796 A1 * | 6/2011 | Fukuda | 331/158 |
| 2012/0067611 A1 * | 3/2012 | Kohda | 174/50.54 |

FOREIGN PATENT DOCUMENTS

| | | | |
|---|---|---|---|
| JP | 53086192 A * | 7/1978 | |
| JP | 10-206455 A | 8/1998 | |
| JP | 2003-142976 A | 5/2003 | |
| JP | 2007-081697 A | 3/2007 | |
| JP | 2007251238 A * | 9/2007 | |
| JP | 2007251239 A * | 9/2007 | |
| JP | 2009206592 A * | 9/2009 | |
| JP | 2011049665 A * | 3/2011 | |

OTHER PUBLICATIONS

International Search Report for International Application No. PCT/JP2008/065246, dated Nov. 4, 2008, 1 page.

* cited by examiner

*Primary Examiner* — J. San Martin
(74) *Attorney, Agent, or Firm* — Brinks Hofer Gilson & Lione

(57) ABSTRACT

A piezoelectric vibrator includes a base substrate and a lid substrate which are bonded to each other with a cavity formed therebetween; a piezoelectric vibrating reed which has a pair of vibration arm portions extending in parallel and is mounted on the base substrate within the cavity; and a getter material of a metallic film that is formed on the base substrate or the lid substrate so as to be arranged within the cavity and improve a degree of vacuum within the cavity by being heated. A restriction portion, which is arranged in the cavity and restricts a scattering direction of the getter material evaporated by the heating to suppress a scattering amount scattering toward the vibration arm portion, is formed in the base substrate or the lid substrate.

6 Claims, 19 Drawing Sheets

PIEZOELECTRIC VIBRATOR HAVING A RESTRICTION PORTION FOR RESTRICTING SCATTERING OF A GETTER MATERIAL, OSCILLATOR, ELECTRONIC EQUIPMENT AND RADIO-CONTROLLED TIMEPIECE

RELATED APPLICATIONS

This application is a continuation of PCT/JP2008/065246 filed on Aug. 27, 2008. The entire contents of these applications are incorporated herein by reference.

TECHNICAL FIELD

The present invention relates to an SMD type (SMD) piezoelectric vibrator in which a piezoelectric vibrating reed is sealed in a cavity formed between two bonded substrates, a piezoelectric vibrator manufacturing method to manufacture the piezoelectric vibrator, an oscillator having the piezoelectric vibrator, electronic equipment and a radio-controlled timepiece.

BACKGROUND ART

In recent years, piezoelectric vibrators using crystals or the like have been used in mobile phones or personal digital assistants, as a time source, a timing source such as a control signal, a reference signal source and the like. Various types of piezoelectric vibrators are provided, an SMD type piezoelectric vibrator is known as one. With this type of piezoelectric vibrator, generally, a three layer structure type, in which piezoelectric substrates formed with a piezoelectric vibrating reed are bonded so as to be interposed from above and below by a base substrate and a lid substrate, is known. In this case, the piezoelectric vibrating reed is accommodated in a cavity (a sealing chamber) formed between the base substrate and the lid substrate.

Furthermore, in recent years, a two layer structure type has also been developed instead of the three layer structure type. This type of piezoelectric vibrator has the two layer structure, in which the base substrate and the lid substrate are directly bonded to each other and the piezoelectric vibrating reed is accommodated within the cavity formed between both substrates. The piezoelectric vibrator of a two layer structure is superior in that thinning can be promoted as compared to the three layer structure and is preferentially used.

However, in a method of manufacturing the piezoelectric vibrator, there is need to perform a process of raising a degree of vacuum in the cavity and making a series resonance resistance value (R1) follow up within a predetermined range. Since the degree of vacuum in the cavity is a factor that affects the frequency (the resonance frequency) of the piezoelectric vibrating reed, this process is one of the crucial processes.

Usually, the process is performed before a minute regulation process (a process of minutely regulating the frequency so that the piezoelectric vibrating reed ultimately vibrates within the range of the nominal frequency), and at the timing when the minute regulation process is performed, there is a need to put the series resonance resistance value (R1) within a suitable predetermined range in advance.

Herein, a method is known of regulating the series resonance resistance value (R1), a method of using a getter material, which is a metallic film such as aluminum, provided in the cavity (for example, see Patent Document 1).

This method, firstly, heats, evaporates and activates the getter material using a laser or the like. Then, the activated getter material absorbs gas mainly consisting of oxygen in the cavity by a chemical reaction while being evaporated. As a consequence, the degree of vacuum in the cavity can be raised and the series resonance resistance value (R1) can be regulated. In addition, a method of regulating the series resonance resistance value (R1) using the getter material is called gettering.

[Patent Citation 1] JP-A-2003-142976

However, in the gettering of the related art, the following problem remains.

Firstly, in a case where the getter material is arranged on the piezoelectric vibrating reed, the piezoelectric vibrating reed is also heated when heating the getter material using a laser. For that reason, there is a chance that the piezoelectric vibrating reed may be affected by the heating.

On the other hand, in a case where the getter material is formed on the substrate around the piezoelectric vibrating reed, there is a high chance that a part of the getter material, which is evaporated and scattered when the getter material is heated using a laser or the like, becomes attached to the piezoelectric vibrating reed. Particularly, the nearer the irradiation position of laser, the easier the evaporated getter material would attach. Incidentally, when the getter material is attached to the piezoelectric vibrating reed, there is a concern that the frequency of the piezoelectric vibrating reed may change. The change in frequency differs depending on the attachment position of the getter material. Particularly, when the getter material is attached to a front end side of the vibration arm portion, the frequency tends to be lowered, and when the getter material is attached to a proximal end side of the vibration arm portion, the frequency tends to be raised. Furthermore, it is known that the greater the attachment amount is, the greater the change amount is.

In this manner, there is a high chance that the frequency of the piezoelectric vibrating reed before and after the gettering is changed by the attachment of the getter material. Usually, the piezoelectric vibrating reed is subjected to a rough regulation process before the gettering, and the frequency regulation is performed so as to be limited within a range that is slightly wider than a nominal frequency of the object. Moreover, after regulating the series resonance resistance value (R1) by the gettering, the minute regulation process is performed to ultimately put the frequency into the range of the nominal frequency. For that reason, when the frequency is changed before or after the gettering, the frequency adjusted to some degree by the rough regulation process is changed. Thus, there is a risk not only that the minute regulation process may be considerably difficult, but also that the stable vibration property may not be obtained.

The invention was made in view of the above circumstances, and an object thereof is to provide a piezoelectric vibrator that does not force a load due to the heating with respect to the piezoelectric vibrating reed and can perform the gettering without generating the frequency change.

Furthermore, another object thereof is to provide an oscillator having the piezoelectric vibrator, electronic equipment and a radio-controlled timepiece, and a method of manufacturing a piezoelectric vibrator.

SUMMARY OF THE INVENTION

The present invention provides the following means to solve the above-mentioned object and achieve the related object:

(1) According to the invention there is provided a method of manufacturing a piezoelectric vibrator which includes a base substrate and a lid substrate which are bonded to each other with a cavity formed therebetween; a piezoelectric vibrating reed which has a pair of vibration arm portions extending in parallel and is mounted on the base substrate within the cavity; and a getter material of a metallic film that improves the degree of vacuum within the cavity by being heated, including: a getter material forming process of forming the getter material on the base substrate or the lid substrate so as to be arranged within the cavity; a restriction portion forming process of forming a restriction portion, which regulates a scattering direction of the getter material evaporated by the heating to suppress a scattering amount scattering toward the vibration arm portion, on the base substrate or the lid substrate so as to be arranged within the cavity; and a bonding process of mounting the piezoelectric vibrating reed on the base substrate after the getter material forming process and the restriction portion forming process is finished, and then, bonding the base substrate and the lid substrate to each other so as to accommodate the piezoelectric vibrating reed, the getter material, and the restriction portion within the cavity, respectively.

According to the method of manufacturing the piezoelectric vibrator, firstly, the getter material forming process of forming the getter material on the base substrate or the lid substrate is performed. At this time, the getter material is formed so as to be arranged within the cavity formed later. Furthermore, at the timing concurrently with or before and after the process, the restriction portion forming process of forming the restriction portion, which regulates the scattering direction of the getter material scattered by the heating to suppress the scattering amount scattered toward the vibration arm portion, on the base substrate or the lid substrate, is performed. At this time, the restriction portion is formed so as to be arranged within the cavity also to be formed later.

In addition, after the above-mentioned two processes are finished, a bonding process is performed. As this process, firstly, the piezoelectric vibrating reed is mounted on the base substrate. As a result, the piezoelectric vibrating reed is mechanically and electrically bonded to the base substrate. Moreover, after mounting the piezoelectric vibrating reed, the base substrate and the lid substrate are bonded to each other so as to accommodate the piezoelectric vibrating reed the getter material and the restriction portion within the cavity, respectively. As a result, it is possible to obtain the piezoelectric vibrator in which the piezoelectric vibrating reed is accommodated within the cavity that is formed between the lid substrate and the base substrate.

Particularly, according to the piezoelectric vibrator, it is possible to perform the gettering without generating a frequency change. That is, when heating the getter material using a laser or the like, a part of the getter material is evaporated and is scattered to the surroundings, but since the restriction portion is formed in the cavity, the scattering direction is restricted. Specifically, it is possible to suppress the scattering amount of the getter material scattered toward the vibration arm portion of the piezoelectric vibrating reed by the restriction portion. For that reason, it is possible to suppress the getter material from being attached to the piezoelectric vibrating reed, particularly the vibration arm portion during gettering. Thus, the frequency change caused by the attachment of the getter material cannot easily occur.

Accordingly, it is possible to actively prevent the frequency from changing before and after the gettering, whereby a minute regulation process to be performed later is made easy and a stable vibration property can be obtained.

Furthermore, the getter material is formed on either one substrate of the base substrate or the lid substrate but not on the piezoelectric vibrating reed. Accordingly, when performing the gettering, even if the getter material is heated using a laser or the like, the piezoelectric vibrating reed is not affected (loaded) by the heating. For this reason, since the quality or the property of the piezoelectric vibrator is not affected, high quality of the piezoelectric vibrator can be promoted.

(2) It may be possible to adopt a configuration in which, at the time of the restriction portion forming process, the restriction portion is protruded from one substrate of the base substrate and the lid substrate to the other substrate thereof and is formed in one substrate side in the shape of a wall so as to be extended along the vibration arm portion in the state of being separated from a side wall of the cavity, and, at the time of the getter material forming process, the getter material is formed in one substrate so as to be arranged between the restriction portion and the side wall portion in a length shorter than that of the restriction portion.

In this case, the restriction portion is formed in one substrate side in the shape of a wall so as to protrude from one substrate (e.g., the lid substrate) to the other substrate (e.g., the base substrate). In addition, in this case, the restriction portion is formed so as to extend along the vibration arm portion in a state of being separated from the side wall of the cavity. That is, the restriction portion is formed so as to divide a space between the vibration arm portion and the side wall of the cavity into two spaces.

Moreover, the getter material is formed in one substrate side so as to be arranged between the restriction portion and the side wall of the cavity. At this time, the getter material is formed in a length shorter than that of the restriction portion. Thus, the restriction portion can always be placed near the getter material.

For that reason, at the time of the gettering, the restriction portion can prevent the getter material from directly scattering toward the vibration arm portion. That is, the scattered getter material cannot reach the vibration arm portion unless it reaches around the restriction portion. For that reason, the scattering amount of the getter material reaching the vibration arm portion can be suppressed. Thus, the getter material cannot easily be attached to the vibration arm portion, whereby the frequency change cannot easily be generated.

(3) It may be possible to adopt a configuration in which, at the time of the restriction portion forming process, the restriction portion is protruded from one substrate of the base substrate and the lid substrate toward the other substrate thereof and is formed in one substrate side so as to extend along the vibration arm portion, and, at the time of getter material forming process, the getter material is formed on the restriction portion or the other substrate so as to accommodate the getter material in a gap between the restriction portion and the other substrate facing each other.

In this case, the restriction portion is formed in one substrate side so as to protrude from one substrate (e.g., the lid substrate) toward the other substrate (e.g., the base substrate). In addition, at this time, the restriction portion is formed so as to extend along the vibration arm portion.

Moreover, the getter material is formed on the restriction portion or the other substrate so as to be accommodated in the gap between the restriction portion and the other substrate facing each other. That is, the getter material is formed so as to be put in the minute gap formed between the restriction portion and the other substrate. As a result, the restriction portion or the other substrate can face each other in the state of being made closer to the getter material.

For that reason, at the time of the gettering, the getter material scattered by the heating is mostly scattered right ahead and is attached to the restriction portion or the other substrate. On the other hand, the remaining part is scattered so as to spread approximately horizontally. However, since the greater part of the most getter material is scattered right ahead and is attached to the restriction portion or the other substrate facing each other, the scattering amount spreading approximately horizontally is little. For that reason, the scattering amount reaching the vibration arm portion can be suppressed. Thus, the getter material can hardly be attached to the vibration arm portion, and the frequency change can hardly be generated.

(4) Furthermore, a piezoelectric vibrator includes a base substrate and a lid substrate which are bonded to each other with a cavity formed therebetween; a piezoelectric vibrating reed which has a pair of vibration arm portions extending in parallel and is mounted on the base substrate within the cavity; and a getter material of a metallic film that is formed on the base substrate or the lid substrate so as to be arranged within the cavity and improve the degree of vacuum within the cavity by being heated, wherein a restriction portion, which is arranged in the cavity and restricts the scattering direction of the getter material evaporated by the heating to suppress a scattering amount scattering toward the vibration arm portion, is formed in the base substrate or the lid substrate.

In this case, it is possible to obtain the same working effect as the method of manufacturing the piezoelectric vibrator described in the above item (1).

(5) It is possible to adopt a configuration in which the restriction portion protrudes from one substrate of the base substrate and the lid substrate toward the other substrate thereof and is formed in one substrate side in the shape of a wall so as to extend along the vibration arm portion in the state of being separated from a side wall of the cavity, and the getter material is formed in the one substrate side so as to be arranged between the restriction portion and the side wall in a length shorter than that of the restriction portion.

In this case, it is possible to obtain the same working effect as the method of manufacturing the piezoelectric vibrator described in the above item (2).

(6) It may be possible to adopt a configuration in which the restriction portion protrudes from one substrate of the base substrate and the lid substrate toward the other substrate thereof, and is formed in the one substrate side so as to extend along the vibration arm portion, and the getter material is formed on the restriction portion or on the other substrate in the state of being accommodated in a gap between the restriction portion and the other substrate facing each other.

In this case, it is possible to obtain the same working effect as the method of manufacturing the piezoelectric vibrator described in the above item (3).

(7) Furthermore, an oscillator according to the invention is configured so that the piezoelectric vibrator described in any one of the above items (4) to (6) is electrically connected to an integrated circuit as an oscillating element.

(8) Furthermore, electronic equipment according to the invention is configured so that the piezoelectric vibrator described in any one of the above items (4) to (6) is electrically connected to a measurement portion.

(9) Furthermore, a radio-controlled timepiece according to the invention is configured so that the piezoelectric vibrator described in any one of the above items (4) to (6) is electrically connected to a filter portion.

With the oscillator, the electronic equipment and the radio-controlled timepiece, since the piezoelectric vibrating reed is not subjected to the load due to the heating and the piezoelectric vibrator is of a high quality, which performs the gettering without generating any frequency change, is included, similarly, high quality can be promoted.

With regard to the piezoelectric vibrator according to the invention, the piezoelectric vibrating reed is not subjected to the load due to the heating, and the gettering can be performed without generating any frequency change. Thus, high quality can be promoted.

Furthermore, with the method of manufacturing the piezoelectric vibrator according to the invention, the above-mentioned vibration can reliably be produced.

Furthermore, with the oscillator, the electronic equipment and the radio-controlled timepiece according to the invention, since the above-mentioned piezoelectric vibrator is included, similarly, high quality can be promoted.

DETAILED DESCRIPTION OF THE PREFERRED EMBODIMENTS

Hereinafter, an embodiment according to the present invention will be explained with reference to FIGS. 1 to 15.

As shown in FIGS. 1 to 5, a piezoelectric vibrator 1 of the present embodiment is formed in the shape of a box, in which a base substrate 2 and a lid substrate 3 are stacked in a two layer structure, and is an SMD type piezoelectric vibrator in which a piezoelectric vibrating reed 4 is accommodated within a cavity C of an inner portion thereof.

Figure 2:
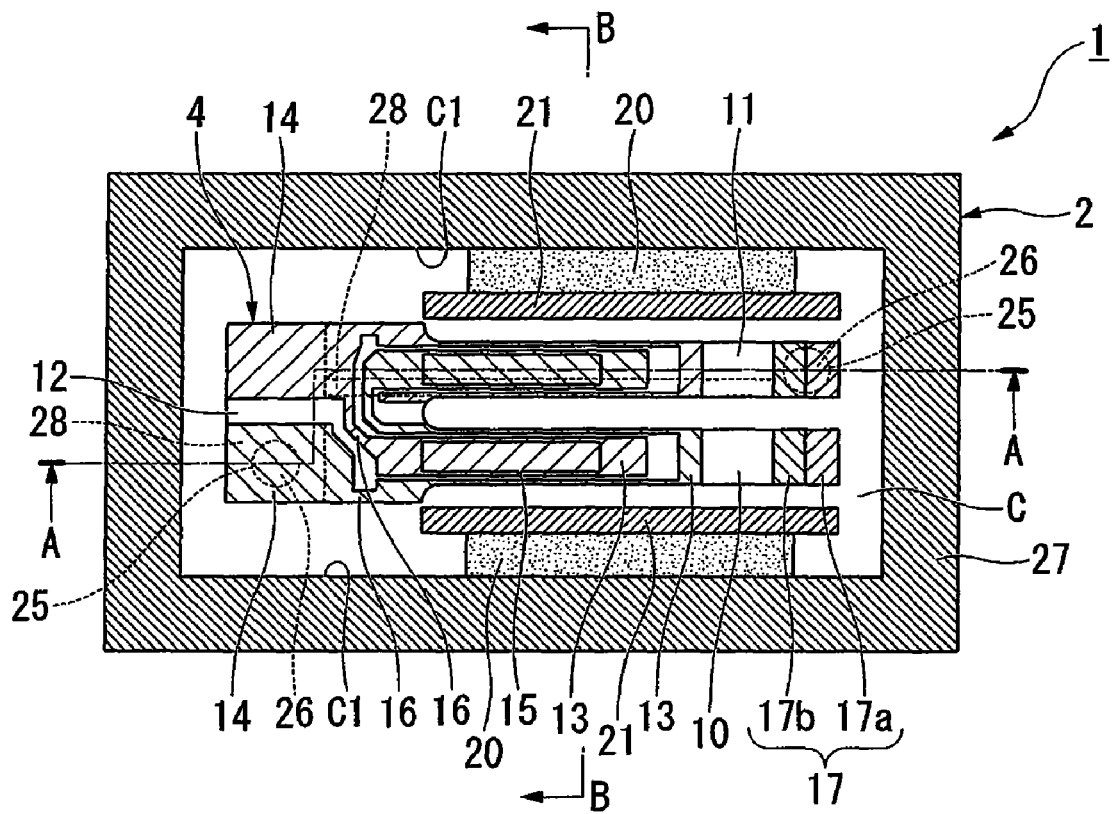
FIG. 2 is a diagram of an inner configuration diagram of the piezoelectric vibrator shown in FIG. 1 which shows a piezoelectric vibrating reed from above with a lid substrate removed therefrom.

Furthermore, in FIG. 2, a restriction portion 21 and a getter material 20 formed in the lid substrate 3 side are jointly shown. Furthermore, in FIG. 5, in order to make the drawings easier to see, excitation electrodes 13, a lead-out electrode 16, a mount electrode 14, and a heavy metal film 17 described later are omitted.

Figure 6:
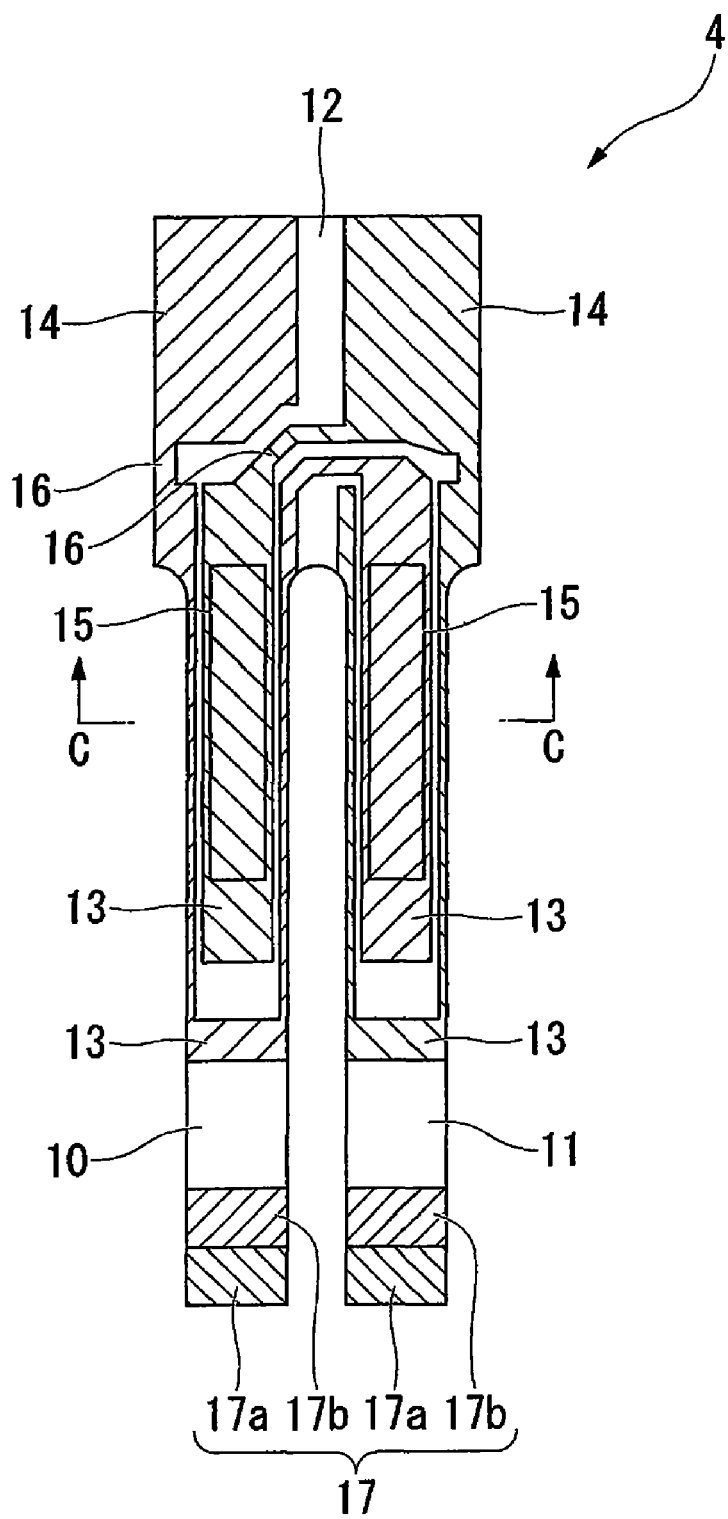
FIG. 6 is a plane view of a piezoelectric vibrating reed constituting the piezoelectric vibrator shown in FIG. 1.
Figure 7:
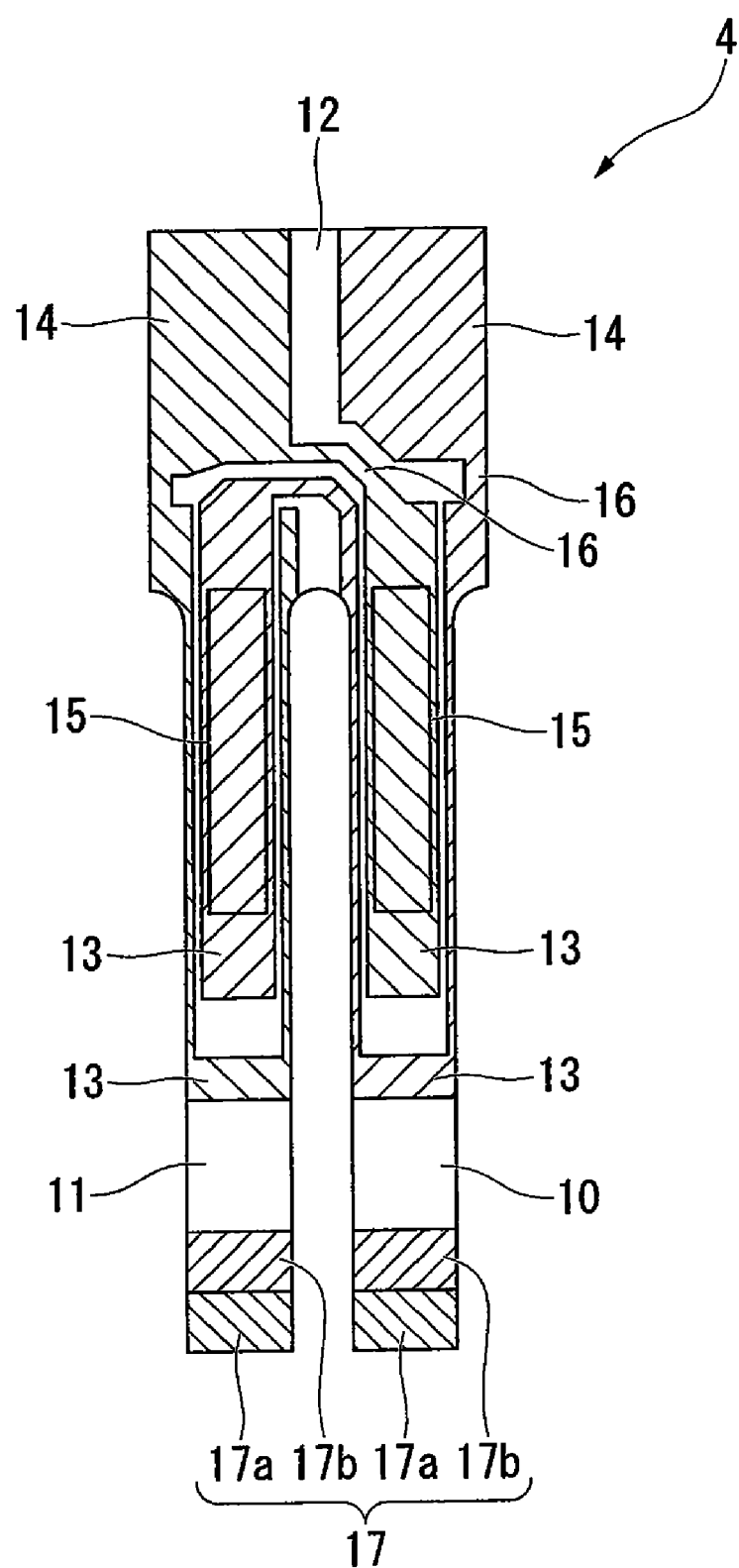
FIG. 7 is a bottom view of the piezoelectric vibrating reed shown in FIG. 5.
Figure 8:
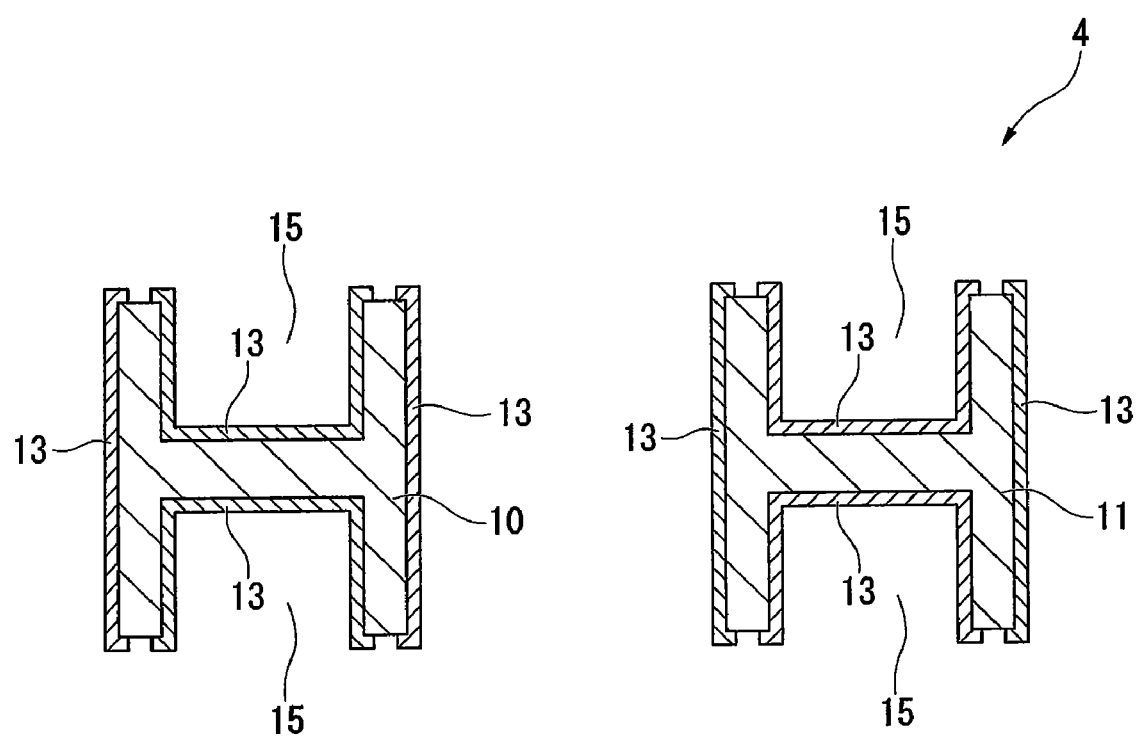
FIG. 8 is a cross-sectional view taken from arrows C-C shown in FIG. 6.

As shown in FIGS. 6 to 8, the piezoelectric vibrating reed 4 is a tuning fork type vibrating reed formed of piezoelectric materials such as crystal, lithium tantalite and lithium niobate, and is vibrated when a predetermined voltage is applied.

The piezoelectric vibrating reed 4 has a pair of vibration arm portions 10 and 11 extending in parallel, a base portion 12 that integrally fixes proximal end sides of the pair of vibration arm portions 10 and 11, an excitation electrode 13 that is formed on outer surfaces of the pair of vibration arm portions 10 and 11 to vibrate the pair of vibration arm portions 10 and 11, and a mount electrode 14 that is electrically connected to the excitation electrode 13.

In addition, the piezoelectric vibrating reed 4 of the present embodiment includes a groove portion 15 that is formed on both main surfaces of the pair of vibration arm portions 10 and 11 along a longitudinal direction of the vibration arm portions 10 and 11, respectively. The groove 15 is formed from the proximal end sides of the vibration arm portions 10 and 11 up to approximately near a middle portion.

The excitation electrodes 13 are electrodes that vibrate the pair of vibration arm portions 10 and 11 in a direction approaching and retracting from each other by a predetermined resonant frequency, and are patterned and formed on the outer surfaces of the pair of vibration arm portions 10 and 11 in a state of being electrically separated, respectively. Specifically, as shown in FIG. 8, one excitation electrode 13 is mainly formed on the groove portion 15 of one vibration arm portion 10 and on both side surfaces of the other vibration arm portion 11, and the other excitation electrode 13 is mainly formed on both side surfaces of one vibration arm portion 10 and on the groove portion 15 of the other vibration arm portion 11.

Furthermore, as shown in FIGS. 6 and 7, the excitation electrodes 13 are electrically connected to the mount electrode 14 via a lead-out electrode 16 on both main surfaces of the base portion 12, respectively. Moreover, the voltage is applied to the piezoelectric vibrating reed 4 via the mount electrode 14.

In addition, the excitation electrode 13, the mount electrode 14 and the lead-out electrode 16 are formed, for example, by the coating of conductive films such as chromium (Cr), nickel (Ni), aluminum (Al) and titanium (Ti).

Furthermore, on the front ends of the pair of vibration arm portions 10 and 11, a heavy metal film 17 for adjusting (frequency adjustment) so as to vibrate its own vibration state within a range of a predetermined frequency is coated. In addition, the heavy metal film 17 is divided into a rough regulation film 17a used when roughly regulating the frequency and a minute regulation film 17b used when minutely regulating the frequency. By performing the frequency regulation using the rough regulation film 17a and the minute regulation film 17b, it is possible to limit the frequencies of the pair of vibration arm portions 10 and 11 within the range of a nominal frequency of a device.

Figure 3:
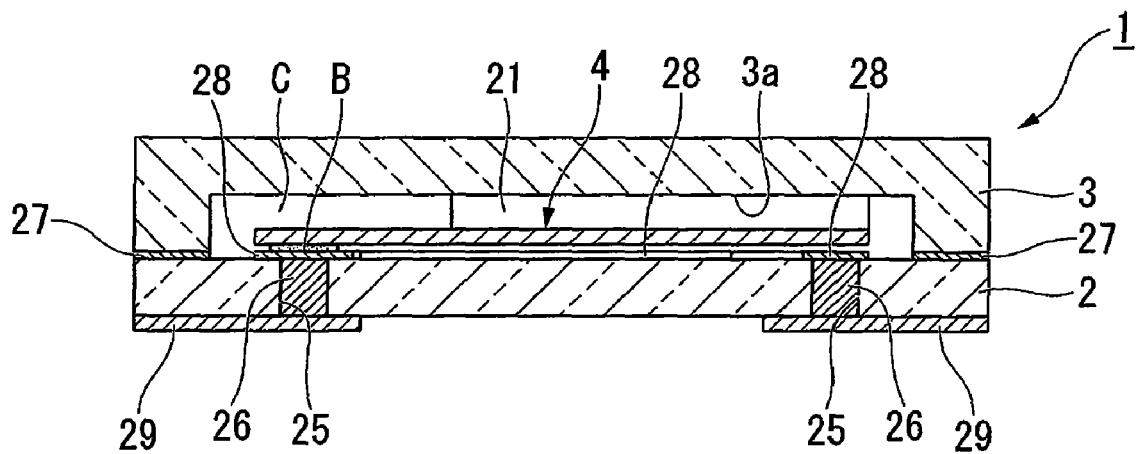
FIG. 3 is a cross-sectional view of the piezoelectric vibrator taken along line A-A shown in FIG. 2.
Figure 4:
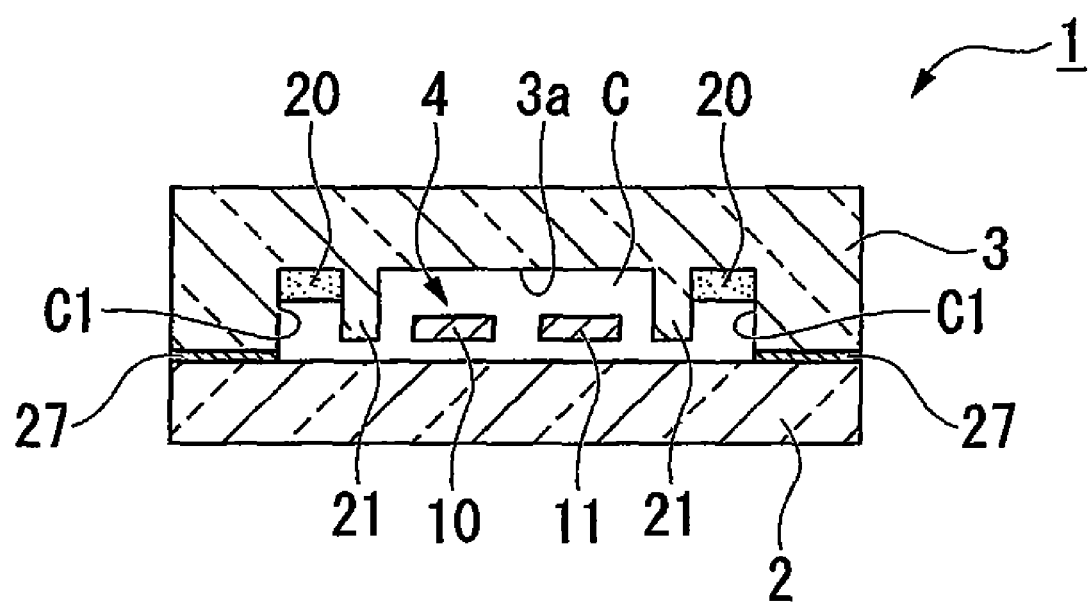
FIG. 4 is a cross-sectional view of the piezoelectric vibrator taken along line B-B shown in FIG. 2.
Figure 5:
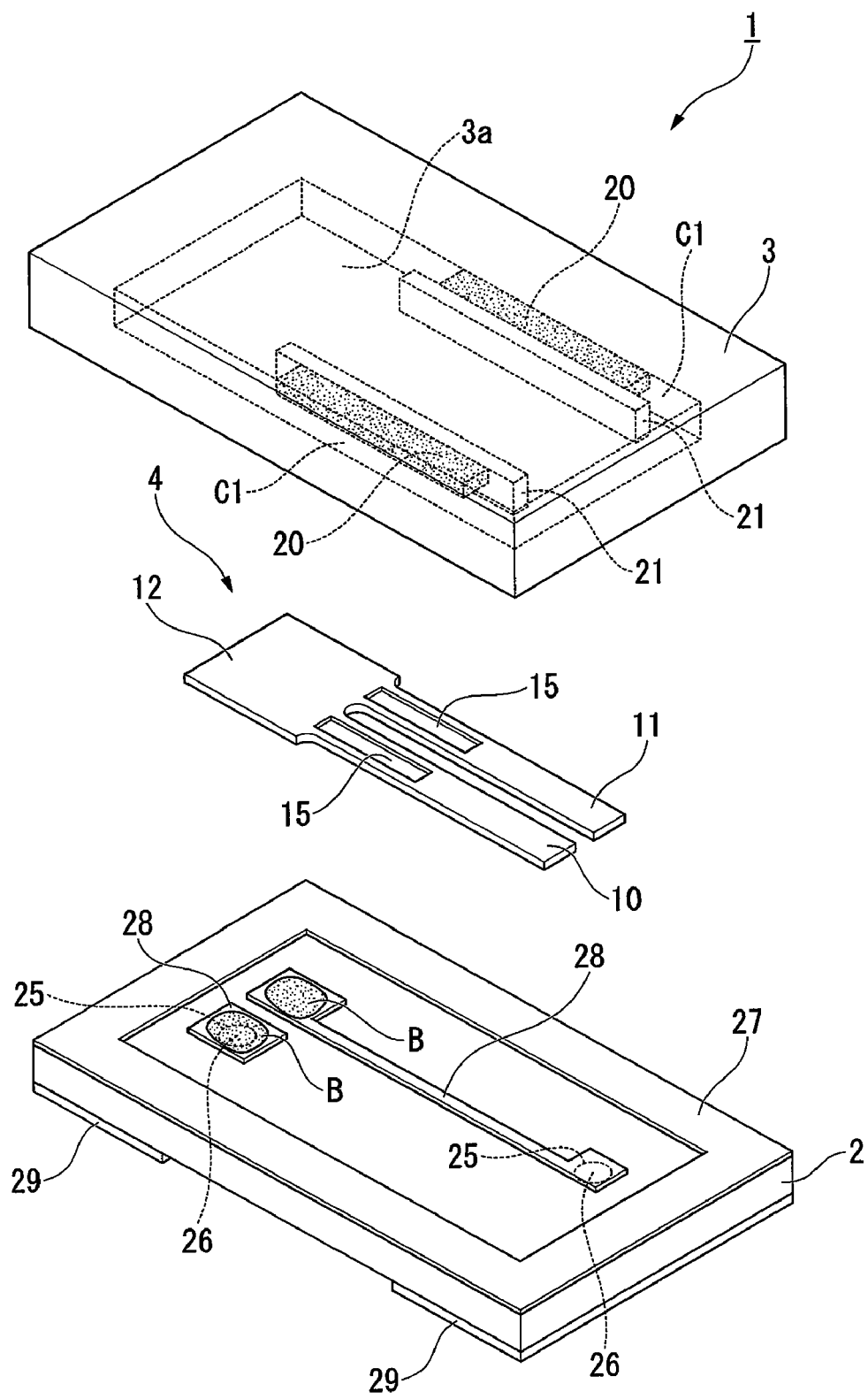
FIG. 5 is an exploded perspective view of the piezoelectric vibrator shown in FIG. 1.

As shown in FIGS. 2, 3 and 5, the piezoelectric vibrating reed 4 configured as above is bump-bonded to the upper surface of the base substrate 2 using a bump B such as gold. More specifically, the pair of mount electrodes 14 is bump-bonded on two bumps B, which are formed on a lead-out electrode 28 described later, respectively, in the contact state. As a result, the piezoelectric vibrating reed 4 is supported in a state floating from the upper surface of the base substrate 2, and the mount electrodes 14 and the lead-out electrode 28 are electrically connected to each other, respectively.

The lid substrate 3 is a transparent insulation substrate formed of a glass material, for example, soda lime glass, and, as shown in FIGS. 1, 3, 4 and 5, is formed in the plate shape. Furthermore, on a lower surface side (a bonding surface side to which the base substrate 2 is bonded) of the lid substrate 3, a rectangular concave portion 3a into which the piezoelectric vibrating reed 4 enters is formed. The concave portion 3a is a concave portion for the cavity becoming the cavity C which accommodates the piezoelectric vibrating reed 4 when both of the substrates 2 and 3 are joined to each other. Moreover, the lid substrate 3 is anode-bonded to the base substrate 2 in a state in which the concave portion 3a is opposed to the base substrate 2 side.

Furthermore, on the lower surface side of the lid substrate 3, a getter material 20 which improves the degree of vacuum in the cavity C by being heated, and a restriction portion 21, which regulates the scattering direction of the getter material 20 evaporated by the heating to suppress the scattering amount scattered toward the pair of vibration arm portions 10 and 11, are formed.

The restriction portion 21 protrudes from the lid substrate 3 toward the base substrate 2. Two restriction portions 21 are formed in the shape of a wall so as to extend along the pair of vibration arm portions 10 and 11 in the state of being separate from a side wall C1 (a side wall of a concave portion 3a) of the cavity C. That is, the restriction portions 21 are formed so as to partition the space between the vibration arm portions 10 and 11 and the side wall C1 of the cavity C into two spaces.

In addition, in the present embodiment, the restriction portions 21 extend by substantially the same length as those of the vibration arm portions 10 and 11 and are adjacent to the vibration arm portions 10 and 11. Furthermore, the restriction portions 21 protrude so as to adjoin the base substrate 2, and a slight gap exists between it and the base substrate 2.

The getter material 20 is a metallic film formed of, for example, aluminum, and is formed so as to be arranged between the restriction portion 21 and the side wall C1 of the cavity C by a length shorter than that of the restriction portion 21. Particularly, since the length of the getter material 20 is shorter than that of the restriction portion 21, the restriction portion 21 necessarily exists near the getter material 20.

The base substrate 2 is a transparent insulation substrate formed of the same glass material as the lid substrate 3, for example, soda lime glass, and, as shown in FIGS. 1 to 5, is formed in the shape of a plate and large enough to be able to overlap with the lid substrate 3.

On the base substrate 2, a pair of through holes 25 penetrating the base substrate 2 is formed. At this time, the pair of through holes 25 is formed so as to be put into the cavity C. To explain in more detail, it is formed so that one through hole 25 is situated at the base portion 12 side of the mounted piezoelectric vibrating reed 4 and the other through hole 25 is situated at the front end sides of the vibration arm portions 10 and 11.

Furthermore, in the present embodiment, the through hole 25 penetrating the base substrate 2 straight ahead is described, but, for example, the through hole 25 may be formed in a taper shape in which a diameter thereof is gradually reduced or expanded toward the lower surface of the base substrate 2 without being limited thereto. In any case, the through hole 25 satisfactorily penetrates the base substrate 2.

Moreover, in the pair of through holes 25, a pair of through electrodes 26, which are formed so as to bury the through holes 25, is formed. The through electrodes 26 play a role in completely blocking the through holes 25 to maintain the airtightness in the cavity C and making an external electrode 29 described later and the lead-out electrode 28 electrically conducted to each other.

On the upper surface side (a bonding surface side to which the lid substrate 3 is bonded) of the base substrate 2, a bonding film 27 for the anode-bonding and a pair of lead-out electrodes 28 are patterned by a conductive material (for example, aluminum). Among them, the bonding film 27 is formed along the periphery of the base substrate 2 so as to surround the periphery of the concave portion 3a formed on the lid substrate 3.

Furthermore, the pair of lead-out electrodes 28 electrically connects the one through electrode 26 of the pair of through electrodes 26 with the one mount electrode 14 of the piezoelectric vibrating reed 4 and is patterned so as to electrically connect the other through electrode 26 with the other mount electrode 14 of the piezoelectric vibrating reed 4. To explain in more detail, as shown in FIGS. 2 and 5, one lead-out electrode 28 is formed immediately over the one through electrode 26 so as to be situated immediately under the base portion 12 of the piezoelectric vibrating reed 4. In addition, the other lead-out electrode 28 is formed so as to be dragged from a position adjacent to one lead-out electrode 28 to the front end side along the vibration arm portion 11, and then be situated immediately over the other through electrode 26.

Moreover, a bump B is formed on the pair of lead-out electrodes 28, the piezoelectric vibrating reed 4 is mounted using the bump B. As a result, one mount electrode 14 of the piezoelectric vibrating reed 4 is electrically conducted to one through electrode 26 via one lead-out electrode 28, and the other mount electrode 14 is electrically conducted to the other through electrode 26 via the other lead-out electrode 28.

Figure 1:
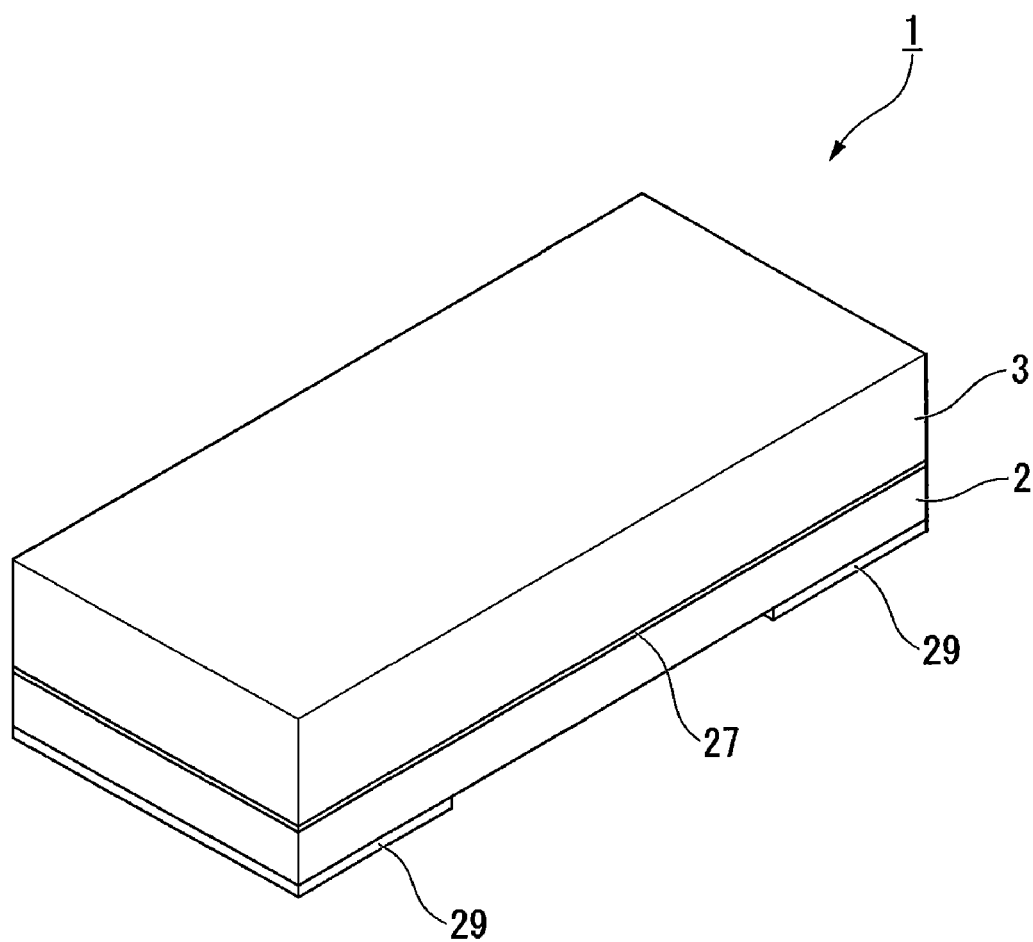
FIG. 1 is an exterior perspective view of a piezoelectric vibrator that shows an embodiment of the invention.

Moreover, as shown in FIGS. 1, 3 and 5, on the lower surface of the base substrate 2, external electrodes 29, which are electrically connected to the pair of through electrodes 26, respectively, are formed. That is, one external electrode 29 is electrically connected to one excitation electrode 13 of the piezoelectric vibrating reed 4 via one through electrode 26 and one lead-out electrode 28. Furthermore, the other external electrode 29 is electrically connected to the other excitation electrode 13 of the piezoelectric vibrating reed 4 via the other through electrode 26 and the other lead-out electrode 28.

In the case of operating the piezoelectric vibrator 1 configured as above, a predetermined driving voltage is applied to the external electrodes 29 formed on the base substrate 2. As a result, it is possible to make the electric current flow to the excitation electrodes 13 of the piezoelectric vibrating reed 4 and to vibrate the pair of vibration arm portions 10 and 11 in the approaching and separating direction by a predetermined frequency. Moreover, it is possible to use the vibration of the pair of vibration arm portions 10 and 11 as a time source, a timing source of the control signal, a reference signal source or the like.

Next, a method of manufacturing a plurality of above-mentioned piezoelectric vibrators 1 using a base substrate wafer 40 and a lid substrate wafer 50 at a time will be explained with reference to the flow chart shown in FIG. 9.

Firstly, a piezoelectric vibrating reed production process is performed to produce the piezoelectric vibrating reed 4 shown in FIGS. 6 to 8 (S10). Specifically, firstly, a crystal Lambert gemstone is sliced at a predetermined angle to make a wafer of a fixed thickness. Next, after the wafer is wrapped and is subjected to rough working, a deformed layer is removed by the etching, and then a mirror surface polishing such as a polish is performed, thereby making a wafer have a predetermined thickness. Next, after the wafer is subjected to a suitable processing such as cleaning, it is patterned by a photolithograph technique to the exterior shapes of the piezoelectric vibrating reed 4, and the film formation and the patterning of the metallic film are performed, thereby forming the excitation electrode 13, the lead-out electrode 16, the mount electrode 14 and the heavy metal film 17. As a result, a plurality of piezoelectric vibrating reeds 4 can be produced.

Furthermore, after producing the piezoelectric vibrating reed 4, the rough regulation of the resonance frequency is performed. This is performed by irradiating the rough regulation film 17a of the heavy metal film 17 with a laser beam to evaporate a part thereof and to change the weight thereof. As a result, the frequency can be limited within a range slightly wider than the nominal frequency of the object. In addition, a minute regulation, in which the resonance frequency is further accurately regulated to put in the range of the final nominal frequency, is performed after the mounting. This will be described later.

Figure 10:
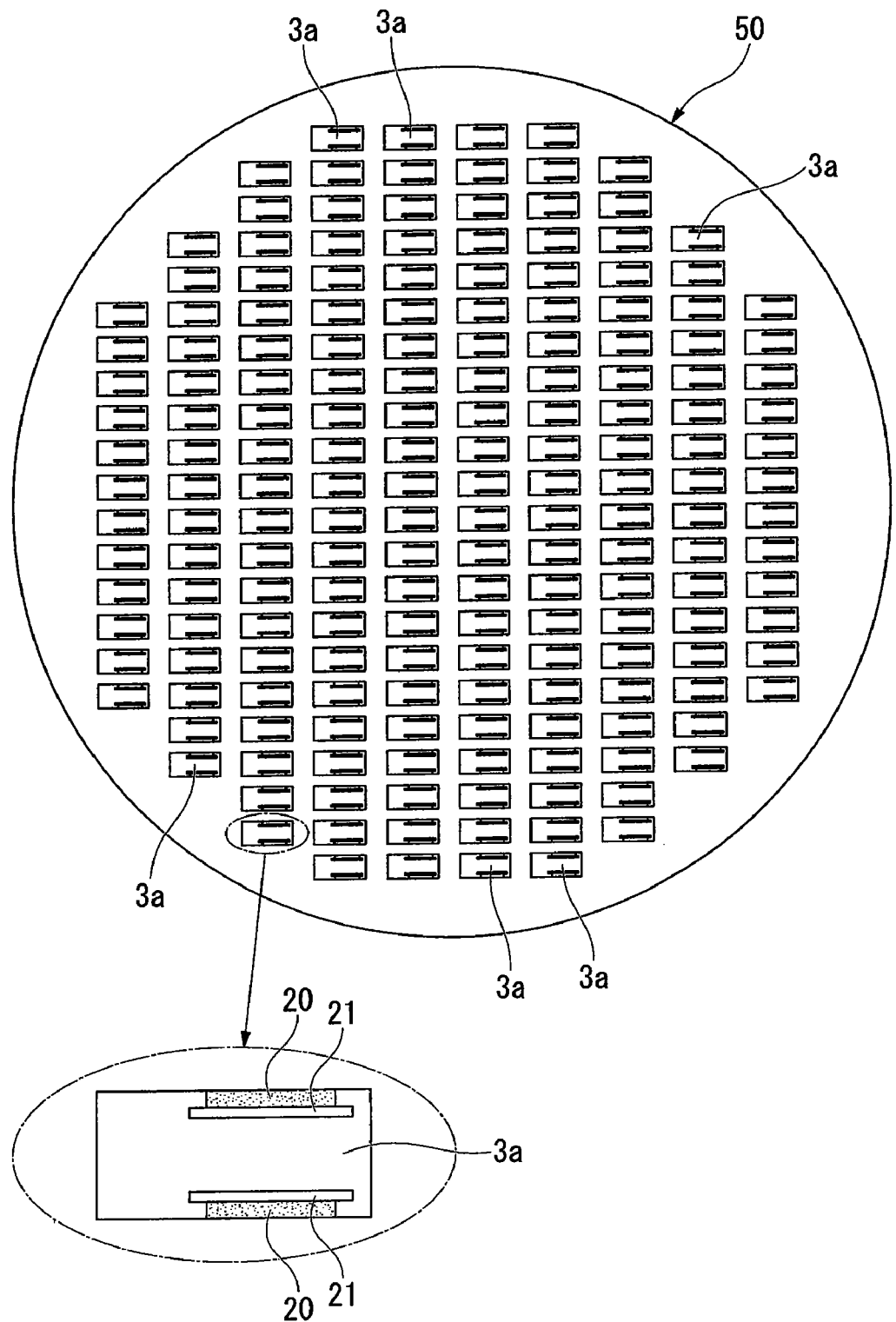
FIG. 10 is a diagram showing a process when manufacturing the piezoelectric vibrator along a flow chart shown in FIG. 9 which shows a state in which a concave portion, a restriction portion and a getter material are formed in a lid substrate wafer becoming a source of the lid substrate.

Next, a first wafer producing process, in which the lid substrate wafer 50 becoming the lid substrate 3 later is produced up to a state immediately before performing anode-bonding, is performed (S20). Firstly, after the soda lime glass is polished up to a predetermined thickness and is cleaned, as shown in FIG. 10, a circular plate shaped lid substrate wafer 50, in which the deformed layer of the uppermost surface is removed by etching or the like, is formed (S21). Next, a concave portion forming process, in which a plurality of concave portions 3a for the cavity C on the bonding surface of the lid substrate wafer 50 in a column and row direction, is performed (S22), and a regulation portion forming process, in which two regulation portions 21 are formed in the respective concave portions 3a, respectively, is performed (S23).

At this time, by etching the lid substrate wafer 50, the concave portion 3a and the restriction portion 21 may be concurrently formed. Furthermore, by pressing the lid substrate wafer 50 from above and below using a jig while heating, the concave portion 3a and the restriction portion 21 may be concurrently formed. In addition, by screen-printing a glass paste in a necessary place on the lid substrate wafer 50, the concave portion 3a and the restriction portion 21 may be concurrently formed. Any method may be used.

Moreover, when forming the restriction portion 21, the restriction portion 21 is formed so as to protrude toward the base substrate 2 and extend along the vibration arm portions 10 and 11 in the state of being separated from the side wall C1 of the cavity C as described above.

Next, a getter material forming process, in which the metallic film is formed to form the getter material 20 within the plurality of concave portions 3a formed on the bonding surface of the lid substrate wafer 50, is performed (S23). At this time, the getter material 20 is formed so as to be arranged between the restriction portion 21 and the side wall C1 of the cavity C by a length shorter than that of the restriction portion 21 formed in the concave portion 3*a*.

At this point in time, the first wafer producing process is finished.

Figure 11:
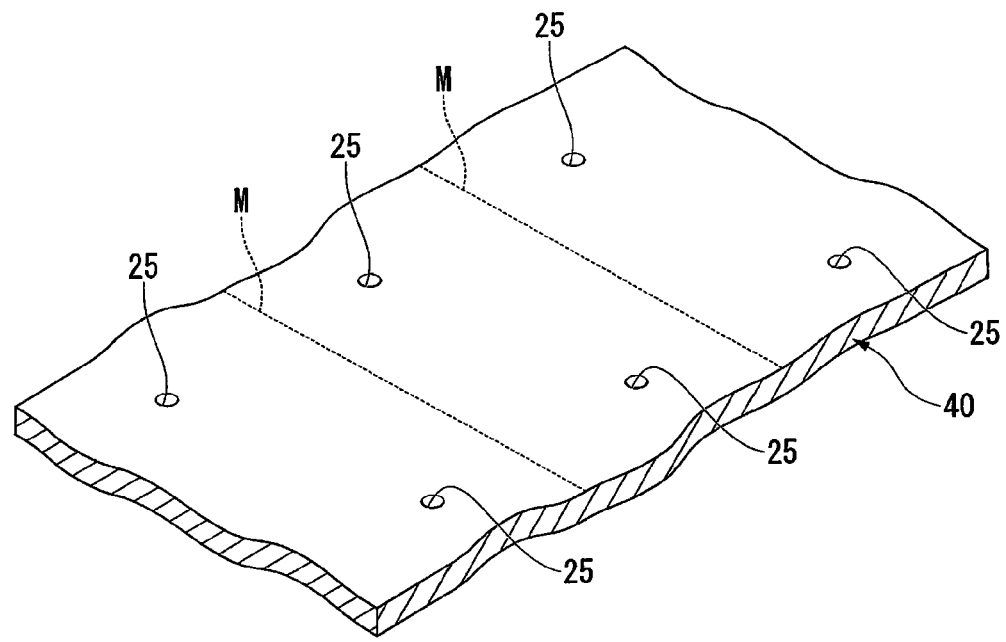
FIG. 11 is a diagram showing a process when manufacturing the piezoelectric vibrator along a flow chart shown in FIG. 9 which shows a state in which a pair of through holes is formed in a base substrate wafer becoming a source of the base substrate.

Next, at the timing simultaneously with or immediately before and after the process, a second wafer producing process, in which the base substrate wafer 40 that later becomes the base substrate 2 is produced until the state immediately before performing anode-bonding, is performed (S30). Firstly, after the soda lime glass is polished up to a predetermined thickness and is cleaned, a circular plate-shaped base substrate wafer 40, in which a deformed layer of the uppermost surface is removed by etching or the like, is formed (S31). Next, as shown in FIG. 11, a through hole forming process, in which a plurality of pairs of through holes 25 penetrating the base substrate wafer 40, is performed (S32). In addition, the dash lines M shown in FIG. 11 show the cutting lines to be cut in a cutting process performed later.

At this point, when overlapping both wafers 40 and 50 later, a plurality of pairs of through holes 25 is formed so as to be put in the concave portion 3*a* formed in the lid substrate wafer 50. In addition, it is formed so that one through hole 25 is situated in the base portion 12 side of the piezoelectric vibrating reed 4 mounted later and the other through hole 25 is situated at the front end side of the vibration arm portion 11.

In addition, methods such as sand blasting or a press working using a jig may be used in forming the through hole 25.

Figure 12:
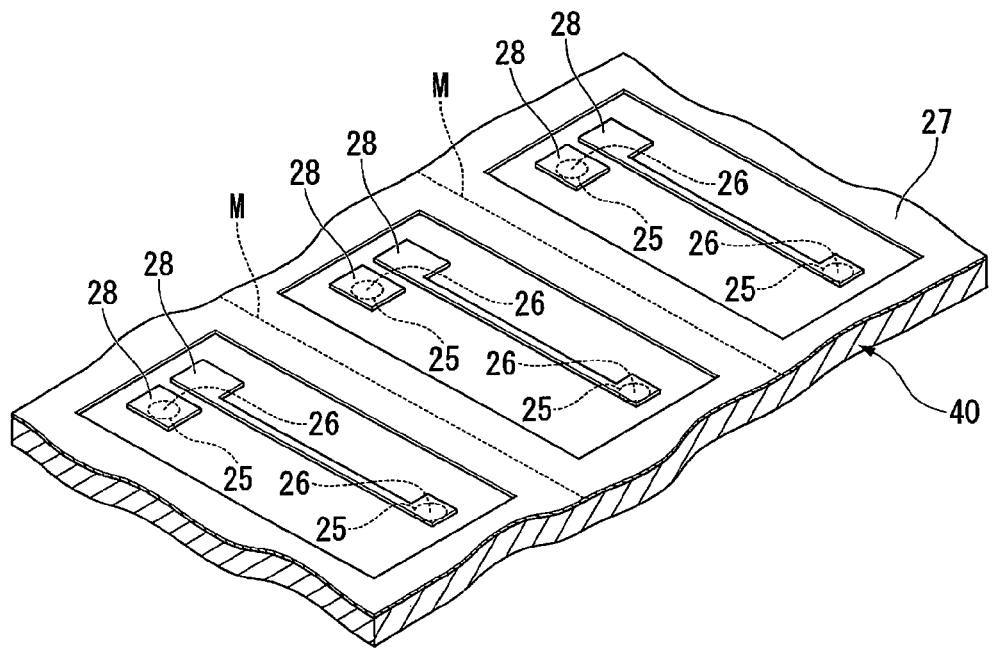
FIG. 12 is a diagram showing a state in which a through electrode is formed in a pair of through holes after the state shown in FIG. 11 and a bonding film and a lead-out electrode are patterned on an upper surface of the base substrate wafer.
Figure 13:
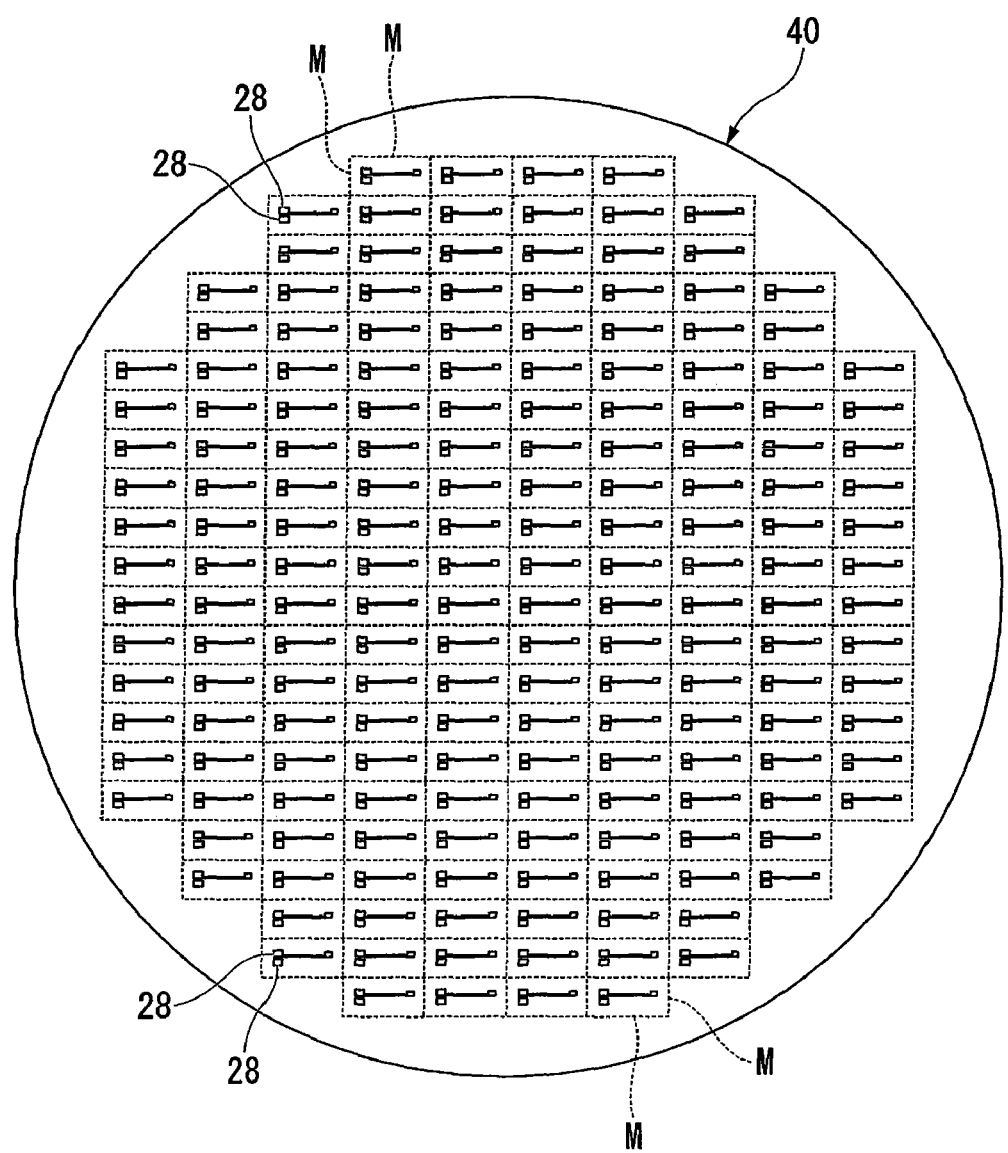
FIG. 13 is an overall diagram of the base substrate wafer of the state shown in FIG. 12.

Next, a through electrode forming process, in which the plurality of pairs of through holes 25 is buried into a conductor (not shown) to form a pair of through electrodes 26, is performed (S33). Next, as shown in FIGS. 12 and 13, a bonding film forming process, in which the conductive material is patterned on the upper surface of the base substrate wafer 40 to form the bonding film 27, is performed (S34), and a lead-out electrode forming process, in which a plurality of lead-out electrodes 28 electrically connected to the pairs of through electrodes 26, respectively is formed, is performed (S35). In addition, the dash lines M shown in FIGS. 12 and 13 show the cutting lines which are cut in a cutting process performed later. Furthermore, in FIG. 13, the bonding film 27 is omitted.

By performing the process, one through electrode 26 is electrically conducted to one lead-out electrode 28, and the other through electrode 26 is electrically conducted to the other lead-out electrode 28. At this point in time, the second wafer producing process is finished.

Figure 9:
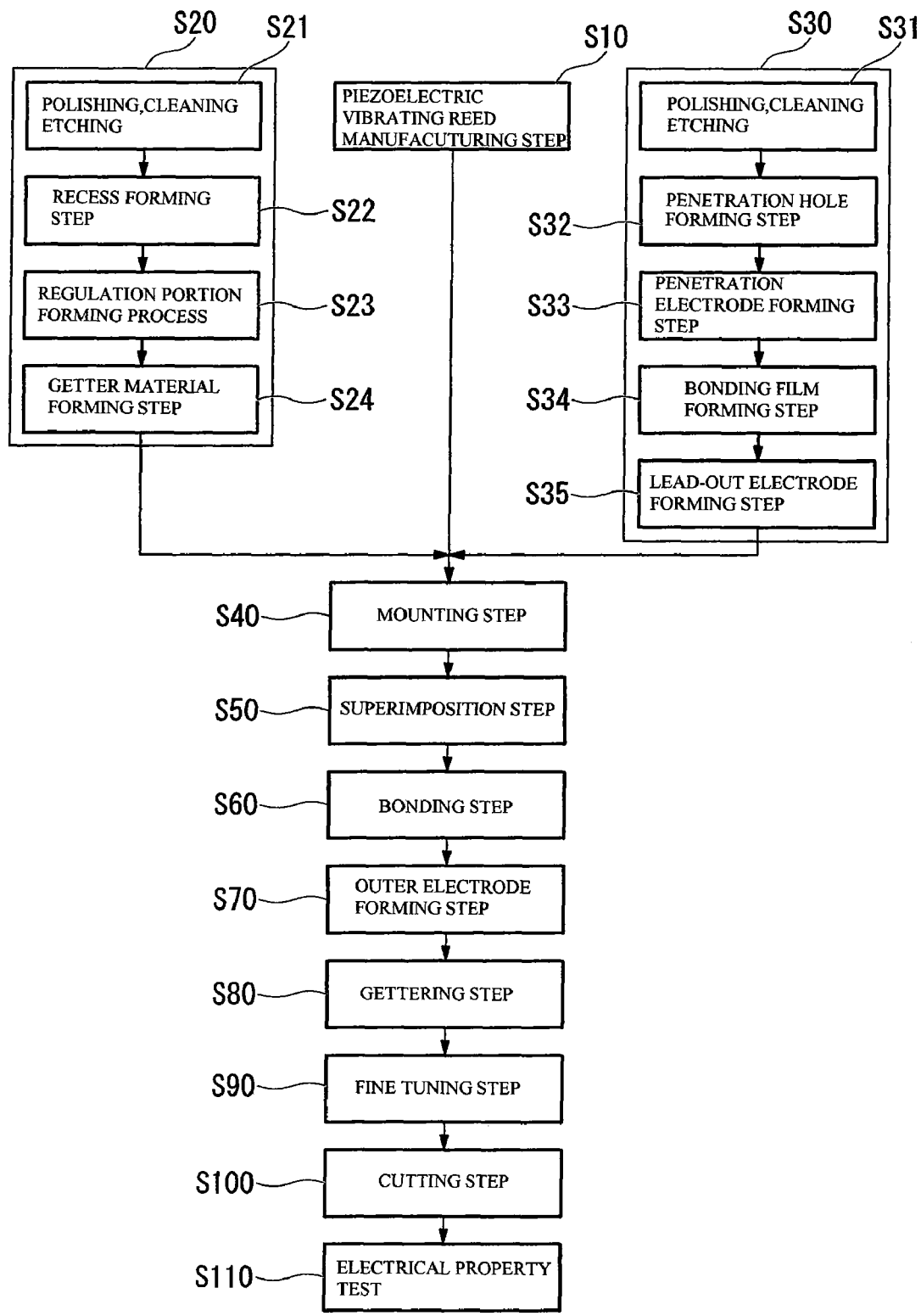
FIG. 9 is a flow chart that shows a flow when manufacturing the piezoelectric vibrator shown in FIG. 1.

However, in FIG. 9, after the bonding film forming process (S34), the lead-out electrode forming process (S35) is sequentially performed, but, on the other hand, after the lead-out electrode forming process (S35), the bonding film forming process (S34) may be performed, or both processes may be concurrently performed. Even in any process order, the same working effect can be obtained. Thus, the process order may be suitably selected and changed as occasion demands.

Next, a mounting process, in which a plurality of produced piezoelectric vibrating reeds 4 is bump-bonded to the upper surface of the base substrate wafer 40 via the lead-out electrodes 28, respectively, is performed (S40). Firstly, the bump B such as gold is formed on the lead-out electrodes 28, respectively. Moreover, after the base portion 12 of the piezoelectric vibrating reed 4 is mounted on the bump B, the piezoelectric vibrating reed 4 is pressed to the bump B while heating the bump B at a predetermined temperature. As a result, the piezoelectric vibrating reed 4 is mechanically supported on the bump B, and the mount electrodes 14 and the lead-out electrodes 28 are electrically connected to each other. Thus, at this point of time, the pair of excitation electrodes 13 of the piezoelectric vibrating reed 4 is electrically conducted to the pair of through electrodes 26, respectively. Particularly, since the piezoelectric vibrating reed 4 is bump-bonded, it is supported in the state of floating from the upper surface of base substrate wafer 40.

After mounting of the piezoelectric vibrating reed 4 is finished, an overlapping process, in which the lid substrate wafer 50 is overlapped with the base substrate wafer 40, is performed (S50). Specifically, both wafers 40 and 50 are aligned in the correct position while setting a standard mark (not shown) as an index. As a result, the piezoelectric vibrating reed 4, the restriction portion 21, and the getter material 20 to be mounted are accommodated within the cavity C which is surrounded by the concave portion 3*a* formed on the base substrate wafer 40 and both wafers 40 and 50.

After the overlapping process, a bonding process, in which the two overlapped wafers 40 and 50 are put in an anode-bonding device (not shown) and a predetermined voltage is applied at a predetermined temperature environment to perform the anode-bonding, is performed (S60). Specifically, a predetermined voltage is applied between the bonding film 27 and the lid substrate wafer 50. Then, an electrochemical reaction occurs in an interface between the bonding film 27 and the lid substrate wafer 50, and both of them are strongly bonded to each other and are subjected to the anode-bonding. As a result, the piezoelectric vibrating reed 4 can be sealed within the cavity C, and it is possible to obtain a wafer body 60 shown in FIG. 14 in which the base substrate wafer 40 and the lid substrate wafer 50 are bonded to each other.

Figure 14:
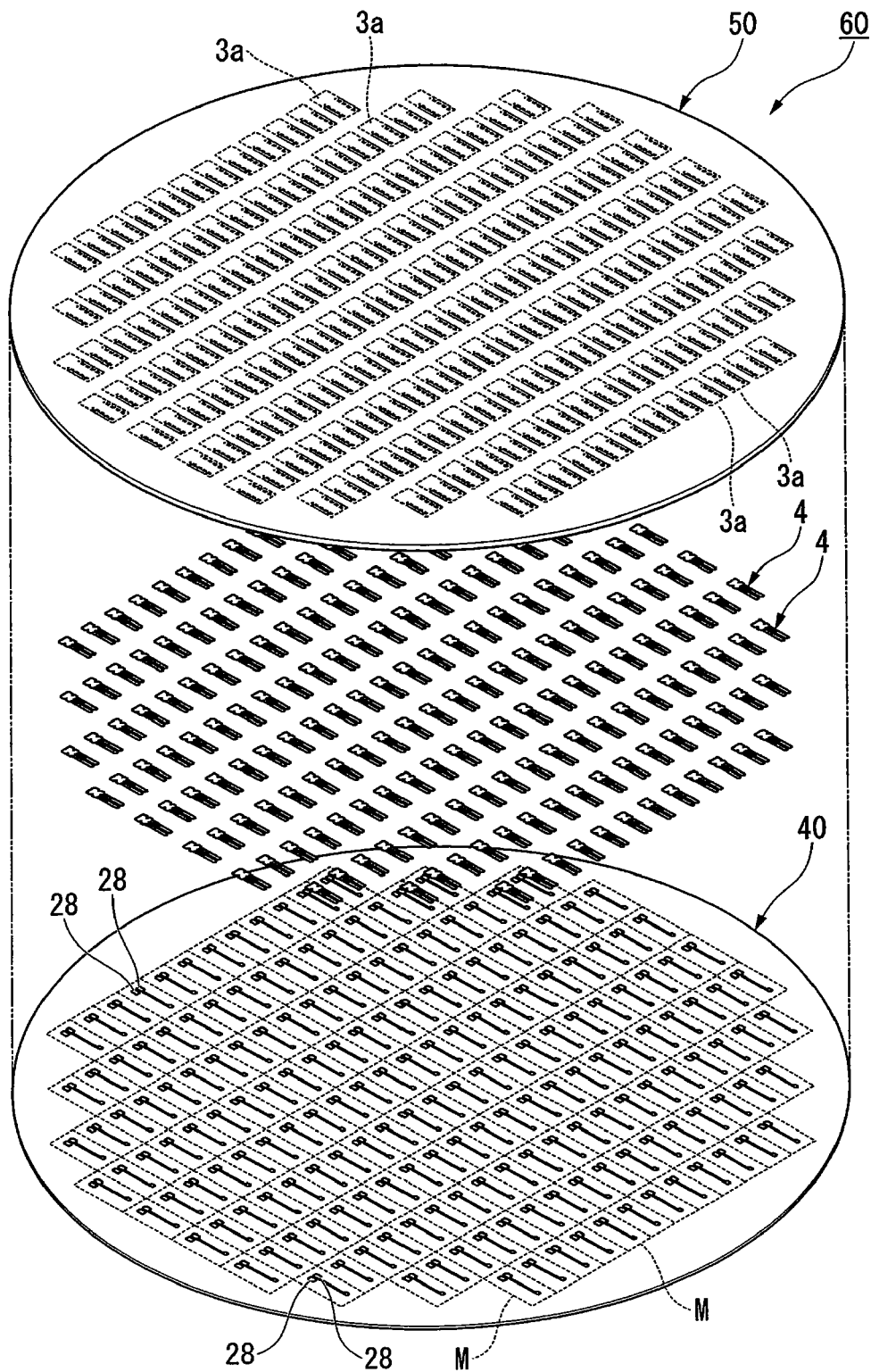
FIG. 14 is a diagram showing a process when manufacturing the piezoelectric vibrator along a flow chart shown in FIG. 9 which shows an exploded perspective view of a wafer body in which the base substrate wafer and the lid substrate wafer are subjected to anode-bonding in a state in which the piezoelectric vibrating reed is accommodated in the cavity.

In addition, in FIG. 14, in order to make the drawing easier to see, the wafer body 60 is shown in an exploded state, and the bonding film 27 from the base substrate wafer 40 is omitted. In addition, the dash lines M shown in FIG. 14 show the cutting lines which are cut in a cutting process performed later.

However, when performing the anode-bonding, the through hole 25 formed in the base substrate wafer 40 is completely blocked by the through electrode 26, and thus the airtightness in the cavity C does not deteriorate through the through hole 25.

Moreover, after the above-mentioned anode-bonding process is finished, an external electrode forming process, in which a conductive material is patterned on the lower surface of the base substrate wafer 40, and a plurality of pairs of external electrodes 29 electrically connected to the pair of through electrodes 26, respectively is formed, is performed (S70). By this process, it is possible to operate the piezoelectric vibrating reed 4 sealed in the cavity C using the external electrodes 29.

Next, a gettering process, in which the getter material 20 accommodated in the respective cavities C of the wafer body 60 is heated to adjust the degree of vacuum within the cavities C, is performed (S80). Specifically, the getter material 20 is heated by irradiating laser from the base substrate wafer 40 many times. Then, the getter material 20 evaporated by the heating absorbs the gas within the cavity C, whereby the degree of vacuum is heightened. As a result, the series resonance resistance value (R1) of the piezoelectric vibrating reed 4 can be regulated.

However, in the present embodiment, when performing the gettering, the gettering can be performed without generating any frequency change of the piezoelectric vibrating reed 4. This point will be explained in detail. When heating the getter material 20 using a laser beam, a part of the getter material 20 is evaporated and scattered to the surroundings, but, since the restriction portion 21 is formed in the cavity C, the scattering direction is restricted. That is, the restriction portion 21 can restrict the getter material 20 from directly scattering toward the vibration arm portions 10 and 11. That is, the scattered getter material 20 cannot reach the vibration arm portions 10 and 11 unless it does not enter by turning around the restriction portion 21. For that reason, the scattering amount of the getter material 20 scattered toward the vibration arm portions 10 and 11 can be suppressed, whereby it is possible to reduce the amount reaching the vibration arm portions 10 and 11.

Thus, at the time of gettering, it is possible to suppress the getter material 20 from being attached to the piezoelectric vibrating reed 4, particularly the vibration arm portions 10 and 11. Thus, any frequency change due to the attachment of the getter material 20 cannot easily be generated.

Next, a minute regulation process, in which in the state of the wafer body 60, the frequency of the respective piezoelectric vibrators 1 sealed in the cavity C is minutely adjusted to put the same within a predetermined range, is performed (S90). To explain specifically, the voltage is applied to the pair of external electrodes 29 to vibrate the voltage vibrating reed 4. Moreover, a laser beam is irradiated from the outside through the lid substrate wafer 50 while measuring the frequency, thereby evaporating the minute regulation film 17b of the heavy metal film 17. As a result, the weight of the front end sides of the pair of vibration arm portions 10 and 11 is changed, which makes it possible to minutely regulate the frequency of the piezoelectric vibrating reed 4 so as to be put into a predetermined range of the nominal frequency.

After the minute regulation of the frequency is finished, a cutting process, in which the bonded wafer body 60 is cut along the cutting lines M shown in FIG. 14 to form small pieces, is performed (S100). As a result, it is possible to manufacture a plurality of SMD type piezoelectric vibrators 1 in which the piezoelectric vibrating reed 4 is sealed in the cavity C formed between the base substrate 2 and the lid substrate 3 that are anode-bonded to each other shown in FIG. 1 at a time.

In addition, after the cutting process (S100) is performed to form the small pieces to the respective piezoelectric vibrators 1, the minute regulation process (S90) may be performed. However, as described above, by performing the minute regulation process (S90) in advance, the minute regulation can be performed in the state of the wafer body 60, which makes it possible to more effectively and minutely regulate the plurality of piezoelectric vibrators 1. Accordingly, it is desirable in that an improvement in throughput can be promoted.

After that, an internal electrical property inspection is performed (S110). That is, the resonant frequency, the resonant resistance value, the drive level property (an excitation electric power dependence of the resonant frequency and the resonant resistance value) or the like of the piezoelectric vibrating reed 4 are measured and checked. Furthermore, the insulation resistance property or the like is jointly checked. Moreover, the exterior inspection of the piezoelectric vibrator 1 is performed at the end, and the size, the quality or the like are finally checked. As a result, the manufacturing of the piezoelectric vibrator 1 is finished.

Particularly, according to the piezoelectric vibrator 1 of the present embodiment, since, at the time of the above-mentioned gettering, the frequency change due to the attachment of the gettering material 20 is hard to occur, it is possible to actively prevent the frequency from changing before and after the gettering. Thus, it is possible to prevent the frequency adjusted to some degree by the rough regulation process from changing. As a result, the frequency can rapidly and reliably be put in the nominal frequency by the minute regulation, whereby the stable vibration property can be obtained. Thus, high quality can be promoted.

In addition, the getter material 20 is formed on the lid substrate 3 but not on the piezoelectric vibrating reed 4. Accordingly, when performing the gettering, even if the getter material 20 is heated, the piezoelectric vibrating reed 4 is not affected (loaded) by the heating. For this reason, since the quality or the property of the piezoelectric vibrator 1 is not affected, high quality of the piezoelectric vibrator can be promoted even in this respect.

Next, an embodiment of the oscillator according to the invention will be explained with reference to FIG. 15.

Figure 15:
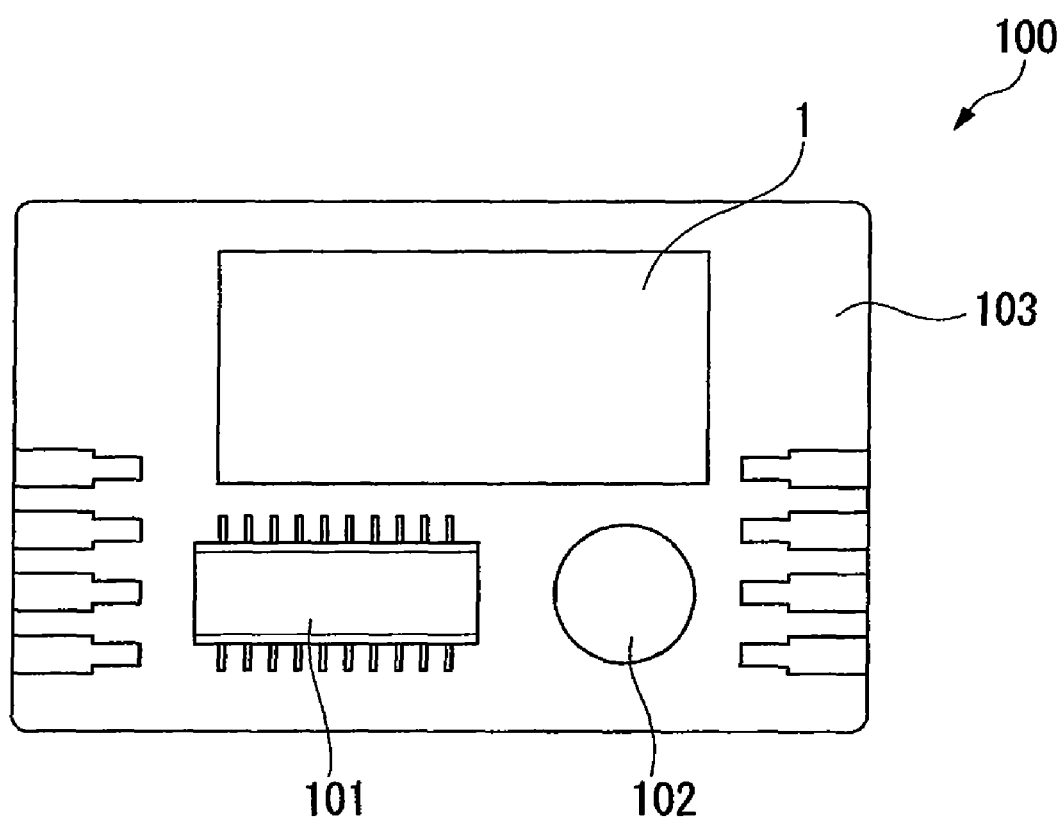
FIG. 15 is a configuration diagram of an oscillator showing an embodiment of the invention.

As shown in FIG. 15, an oscillator 100 of the present embodiment is constituted as an oscillating element in which the piezoelectric vibrator 1 is electrically connected to an integrated circuit 101. The oscillator 100 includes a substrate 103 on which an electronic component 102 such as a condenser is mounted. The integrated circuit 101 for the oscillator is mounted on the substrate 103, and the piezoelectric vibrating reed 4 of the piezoelectric vibrator 1 is mounted in the vicinity of the integrated circuit 101. The electronic component 102, the integrated circuit 101 and the piezoelectric vibrator 1 are electrically connected to each other by a wiring pattern (not shown), respectively. In addition, the respective constituents are molded by resin (not shown).

In the oscillator 100 configured as above, when the voltage is applied to the piezoelectric vibrator 1, the piezoelectric vibrating reed 4 in the piezoelectric vibrator 1 is vibrated. The vibration is converted to an electric signal by the piezoelectric property of the piezoelectric vibrating reed 4 and input in the integrated circuit 101 as the electric signal. The input electric signal is subjected to the respective processing by the integrated circuit 101 and is output as the frequency signal. As a result, the piezoelectric vibrator 1 functions as the oscillator.

Furthermore, in the configuration of the integrated circuit 101, by selectively setting an RTC (Real Time Clock) module or the like, for example, depending on the demand, the function of controlling the operating date or time of the equipment or external equipment, in addition to the timepiece single function oscillator or the like, or providing the time or the calendar or the like can be added.

As mentioned above, according to the oscillator 100 of the present embodiment, since it includes the piezoelectric vibrator 1 of a high quality, the oscillator 100 itself can also promote high quality. Additionally, it is possible to obtain the high precision frequency signal that is stable over a long period of time.

Figure 16:
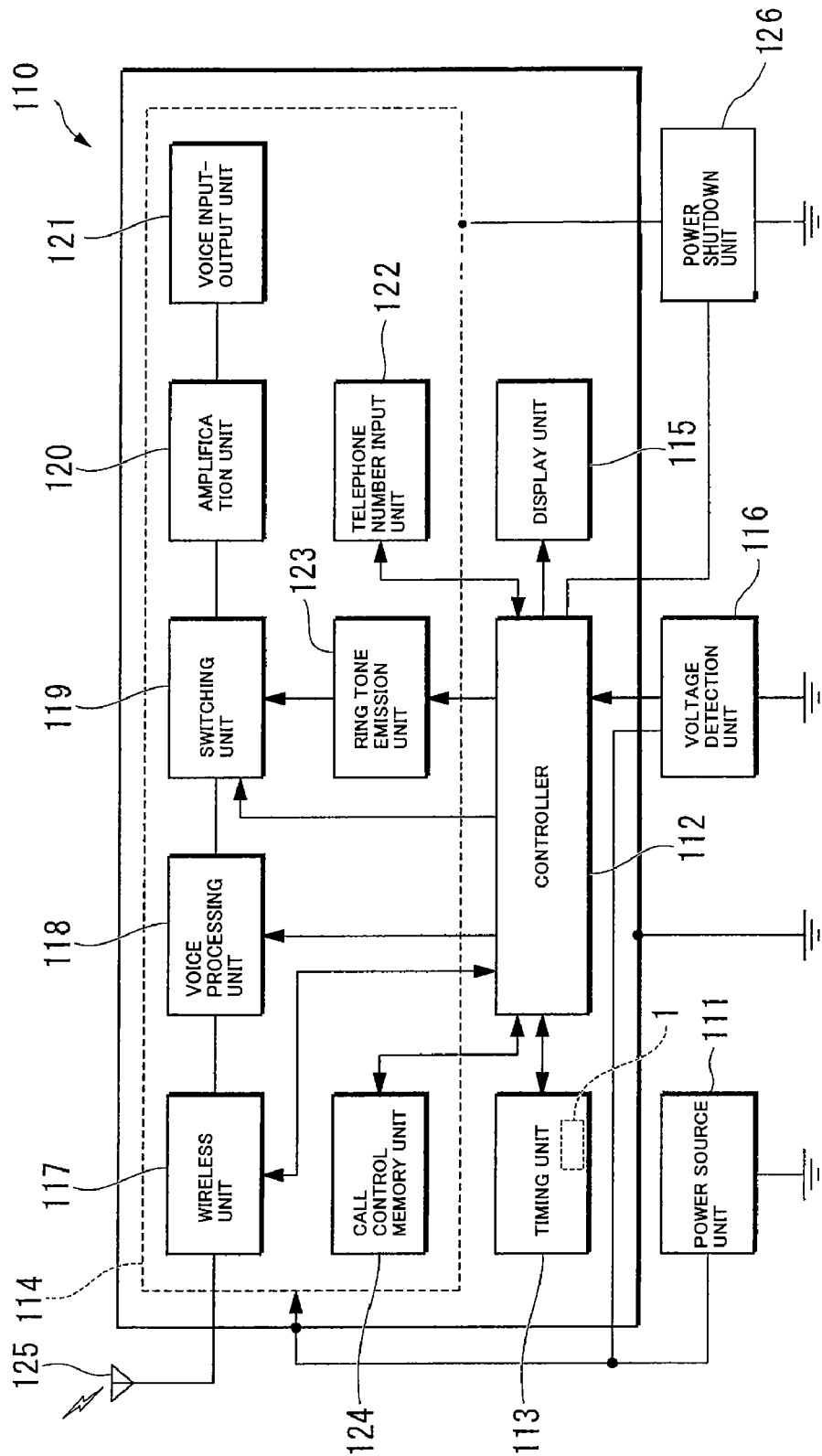
FIG. 16 is a configuration diagram of electronic equipment showing an embodiment of the invention.

Next, an embodiment of the electronic equipment according to the invention will be explained with reference to FIG. 16. Furthermore, as the electronic equipment, portable information equipment 110 having the above-mentioned piezoelectric vibrator 1 will be explained as an example. Firstly, the portable information equipment 110 of the present embodiment is represented by, for example, a mobile phone, and is one in which a wrist watch in the related art is developed and improved. The exterior thereof is similar to a wrist watch, where a liquid crystal display is arranged on a portion equivalent to the hour plate, and the present time or the like can be displayed on the screen. Furthermore, when it is used as a communicator, it can be separated from the wrist and can perform the same communication as the mobile phone of the related art by a speaker and a microphone built in an inner portion of the band. However, as compared to the mobile phone of the related art, it is radically miniaturized and lightened.

Next, the configuration of the portable information equipment 110 of the present embodiment will be explained. As shown in FIG. 16, the portable information equipment 110 includes the piezoelectric vibrator 1 and a power source portion 111 for supplying the electric power. The power source portion 111 includes, for example, a lithium secondary battery. A control portion 112 which performs various controls, a measurement portion 113 performing the count of the time or the like, a communication portion 114 performing the communication with the outside, a display portion 115 displaying various information, and a voltage detection portion 116 detecting the voltage of the respective functional portions are connected to the power source portion 111 in parallel. Moreover, the respective functional portions are provided with the electric power by the power source portion 111.

The control portion 112 controls the respective functional portions to perform the motion control of the whole system such as the transmission and the reception of the sound data, or the measurement or the display of the current time. Furthermore, the control portion 112 includes a ROM with a program written thereon in advance, a CPU that reads and executes the program written on the ROM, and a RAM or the like used as a work area of the CPU.

The measurement portion 113 includes an integrated circuit, which is equipped with an oscillation circuit, a register circuit, a counter circuit, interface circuit or the like, and the piezoelectric vibrator 1. When the voltage is applied to the piezoelectric vibrator 1, the piezoelectric vibrating reed 4 is vibrated and the vibration is converted to the electric signal by the piezoelectric property of crystal, and is input to the oscillation circuit as the electric signal. The output of the oscillation circuit is binarized and is counted by the resister circuit and the counter circuit. Moreover, the signal is transmitted to and received from the control portion 112 via the interface circuit, and the current time, the current date, the calendar information or the like is displayed on the display portion 115.

The communication portion 114 has the same function as the mobile phone of the related art, and includes a wireless portion 117, a sound processing portion 118, a switch-over portion 119, an amplification portion 120, a sound input and output portion 121, a phone number input portion 122, a receiving sound generation portion 123, and a call control memory portion 124.

The wireless portion 117 performs the exchange of the transmission and the reception of various data such as sound data with a base station via an antenna 125. The sound processing portion 118 encodes and decrypts the sound signal input from the wireless portion 117 or the amplification portion 120. The amplification portion 120 amplifies the signal, which is input from the sound processing portion 118 or the sound input and output portion 121, to a predetermined level. The sound input and output portion 121 includes a speaker, a microphone or the like, amplifies the receiving sound or the receipt sound, or collect the sound.

Furthermore, the receiving sound generation portion 123 creates the receiving sound according to calls from the base station. The switch-over portion 119 switches the amplification portion 120 connected to the sound processing portion 118 to the receiving sound generation portion 123 only when receiving, whereby the receiving sound created in the receiving sound generation portion 123 is output to the sound input and output portion 121 via the amplification portion 120.

In addition, the call control memory portion 124 stores the program relating to the departure and the arrival of the communication. Furthermore, the phone number input portion 122 includes, for example, number keys from 0 to 9 and other keys, and by pushing the number keys or the like, the phone number of the call destination or the like is input.

The voltage detection portion 116 detects the voltage drop and notifies it to the control portion 112 when the voltage added to the respective function portions such as the control portion 112 by the power source portion 111 is lower than a predetermined value. The predetermined voltage value of this time is a value which is preset as a minimum voltage necessary for stably operating the communication portion 114, and, for example, is about 3V. The control portion 112 receiving notification of a voltage drop from the voltage detection portion 116 prohibits the operation of the wireless portion 117, the sound processing portion 118, the switch-over portion 119 and the receiving sound generation portion 123. Particularly, stopping the operation of the wireless portion 117 having a high rate of electric power consumption is essential. Furthermore, the intent that the communication portion 114 becomes unusable due to the lack of the battery residual quantity is displayed on the display portion 115.

That is, the operation of the communication portion 114 can be prohibited by the voltage detection portion 116 and the control portion 112 and the intent can be displayed on the display portion 115. The display may be a text message, but as a more intuitive display, an X (cross) display may be made on a phone icon displayed on the upper portion of the display surface of the display portion 115.

In addition, the power source shut-off portion 126 which can selectively shut off the power source of the portion relating to the function of the communication portion 114 is included, whereby the function of the communication portion 114 can further reliably be stopped.

As mentioned above, according to the portable information equipment 110 of the present embodiment, since it includes the piezoelectric vibrator 1 of a high quality, the portable information equipment itself also can promote high quality. Additionally, it is possible to display the high precision timepiece information which is stable for a long period of time.

Next, an embodiment of a radio-controlled timepiece according to the invention will be explained with reference to FIG. 17.

Figure 17:
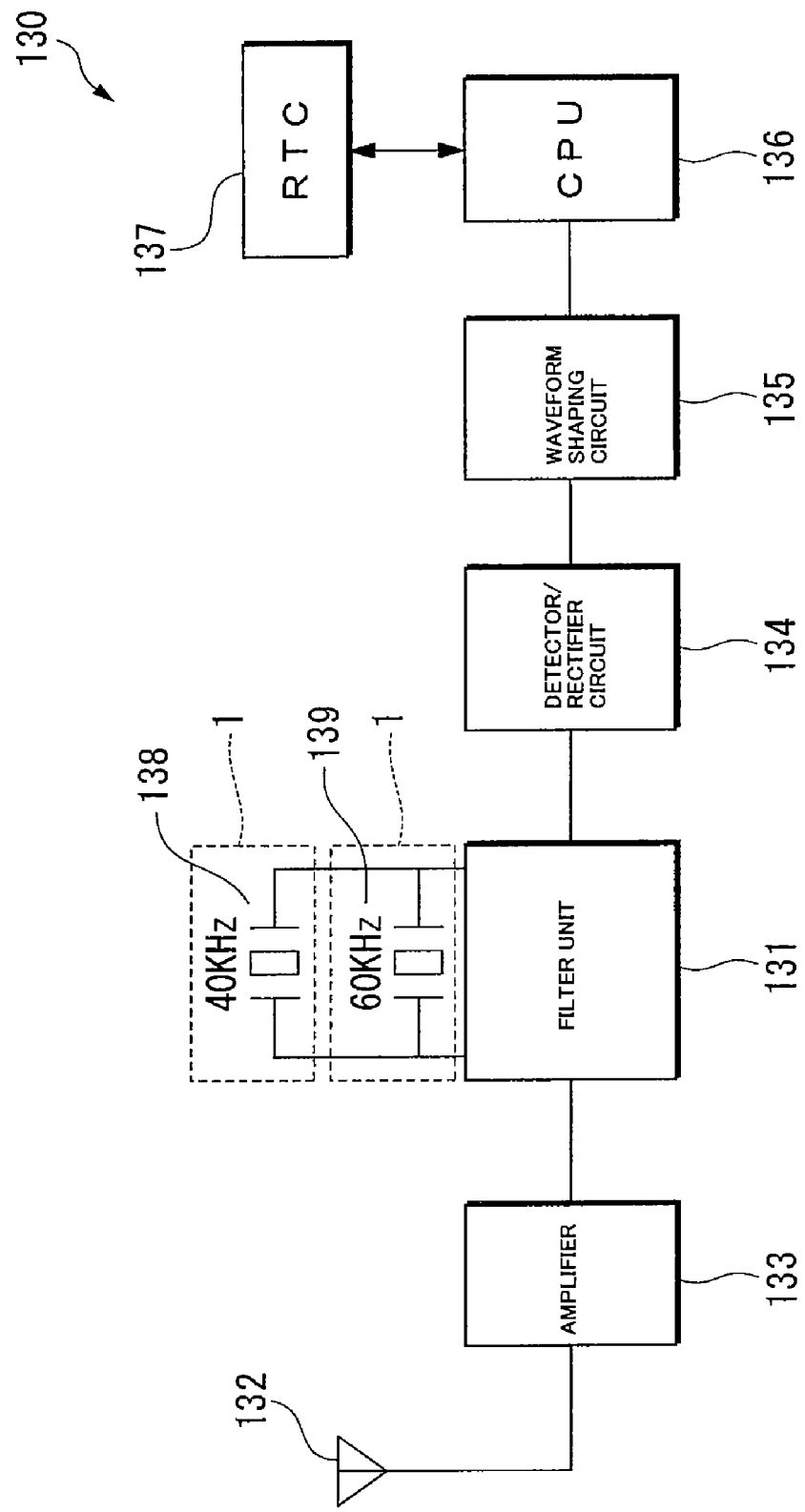
FIG. 17 is a configuration diagram of a radio-controlled timepiece showing an embodiment of the invention.

As shown in FIG. 17, a radio-controlled timepiece 130 of the present embodiment is a timepiece which includes the piezoelectric vibrator 1 that is electrically connected to a filter portion 131 and includes the function of receiving standard radio waves including the timepiece information and automatically correcting and displaying the same as the correct time.

In Japan, transmitting stations for transmitting standard radio waves exist in Fukushima prefecture (40 KHz) and Saga prefecture (60 KHz), and each transmits the standard radio waves, respectively. Since long waves such as 40 KHz or 60 KHz have a property of spreading across the surface of the earth and a property of spreading while reflecting between the ionization layer and the surface of the earth, the spreading range is wide, and the above-mentioned two transmitting stations cover the whole of Japan.

Hereinafter, a functional configuration of the radio-controlled timepiece 130 will be explained in detail.

An antenna 132 receives the standard radio waves of the long waves at 40 KHz or 60 KHz. The standard radio waves of the long waves apply an AM modulation to the transport waves of 40 KHz or 60 KHz in a time information called a time code. The standard radio waves of the received long waves are amplified by an amp 133 and are filtered and tuned by a filter portion 131 having a plurality of piezoelectric vibrators 1.

The piezoelectric vibrator 1 of the present embodiment includes crystal vibrator portions 138 and 139 having the same resonant frequencies of 40 KHz and 60 KHz as the transport frequency, respectively.

The signal of the filtered predetermined frequency is detected and demodulated by a detection and rectifier circuit 134. Next, the time code is taken out via a wave shaping circuit 135 and is counted by a CPU 136. In the CPU 136, information such as current year, accumulated date, day of the week, and time is read. The read information is reflected in an RTC 137 and the correct time information is displayed.

Since the transport waves are 40 KHz or 60 KHz, a vibrator having the above-mentioned tuning fork type structure is suitable for the crystal vibrator portions 138 and 139.

In addition, the aforementioned explanation was shown by an example in Japan, but the frequencies of the standard radio waves of the long waves differ in foreign countries. For example, standard radio waves of 77.5 KHz are used in Germany. Thus, in a case where the radio-controlled timepiece 130 capable of coping in foreign countries is built in a mobile phone, there is a need for the piezoelectric vibrator 1 having a different frequency from the case in Japan.

As mentioned above, according to the radio-controlled timepiece 130 of the present embodiment, since it includes the piezoelectric vibrator 1 of a high quality, the radio-controlled timepiece itself can also promote high quality. Additionally, it is possible to stably and accurately count the time over a long period of time.

In addition, the technical scope of the invention is not limited to the above embodiments but various modifications can be added within a scope without departing from the gist of the invention.

For example, in the above-mentioned embodiment, the restriction portion 21 and the getter material 20 are formed in the lid substrate 3, but they may be formed in the base substrate 2 side. Even in this case, the same working effect can be obtained.

Figure 18:
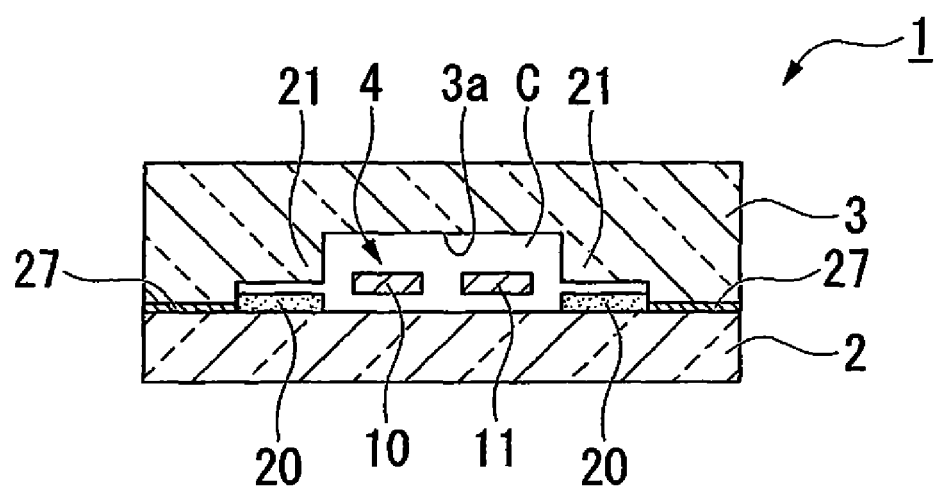
FIG. 18 is a cross-sectional view showing a modified example of the piezoelectric vibrator of the invention.
Figure 19:
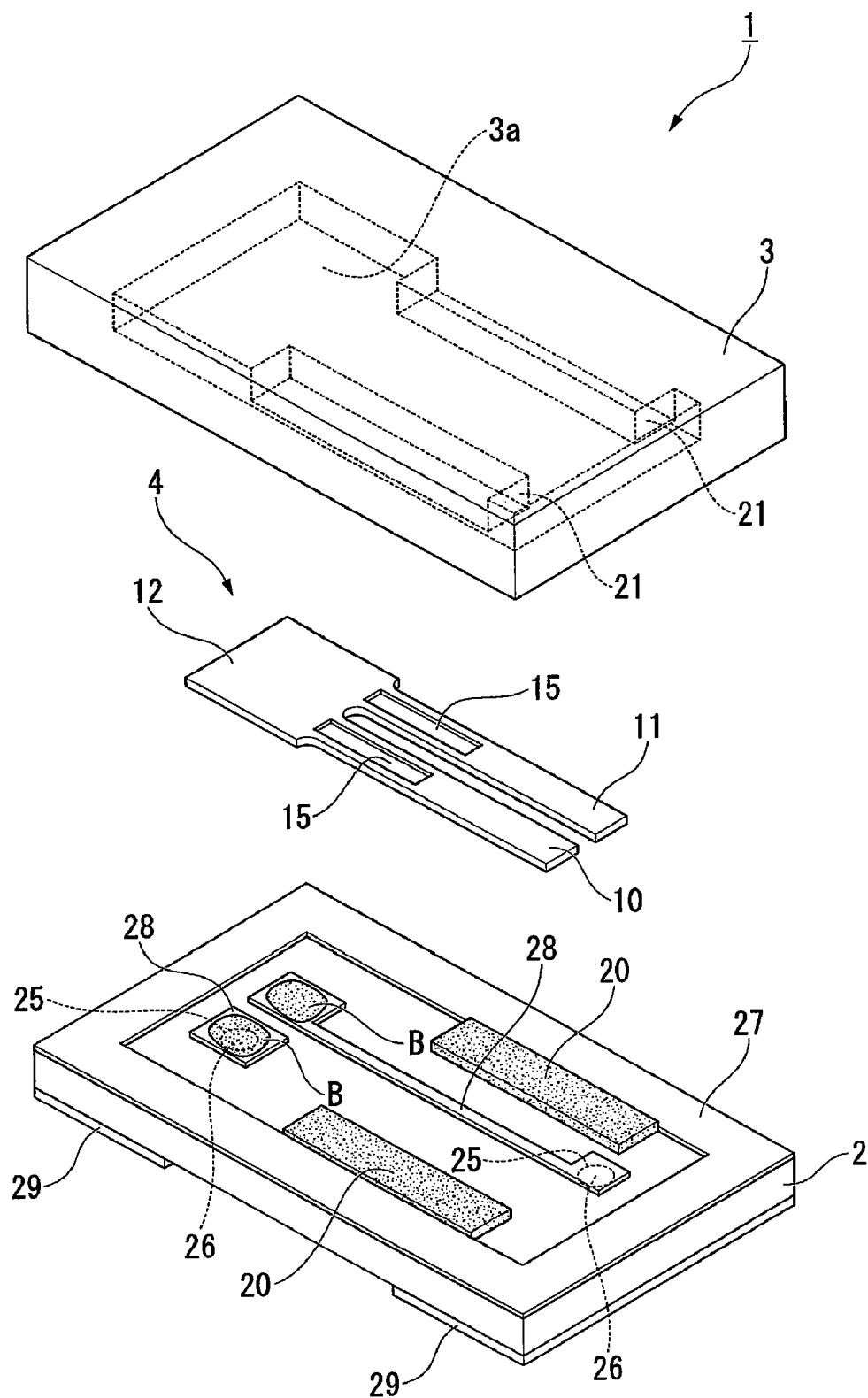
FIG. 19 is an exploded perspective view of the piezoelectric vibrator shown in FIG. 18.

Furthermore, as an example of the restriction portion 21, the wall-shaped restriction portion 21 extending along the vibration arm portions 10 and 11 in the state of being separated from the side wall C1 of the cavity C is explained, but the restriction portion 21 is limited thereto. For example, as shown in FIGS. 18 and 19, the restriction portion 21 may be formed in the lid substrate 3 so as to protrude toward the base substrate 2 and extend along the vibration arms 10 and 11. In this case, the getter material 20 may be formed on the base substrate 2 so as to be accommodated in the gap formed between the restriction portion 21 and the base substrate 2 facing each other. As a result, the restriction portion 21 can face the getter material 20 in the adjoined state.

When the invention is configured in this manner, at the time of the gettering, the greater part of the getter material 20 scattered by the heating is scattered right ahead and is attached to the restriction portion 21. On the other hand, the remaining part thereof is scattered so as to spread approximately horizontally. However, since the greater part of the getter material 20 is scattered right ahead and is attached to the restriction portion 21, the scattering amount scattered so as to be spread approximately horizontally is minimal. For that reason, the scattering amount of the getter material 20 reaching the vibration arm portions 10 and 11 can be suppressed. Thus, the getter material 20 can hardly be attached to the vibration arm portions 10 and 11, and similarly, the frequency change can hardly be generated before and after the gettering.

In addition, in this case, the getter material 20 may be formed in the restriction portion 21 side. Even in this case, the same working effect can be obtained.

Figure 20:
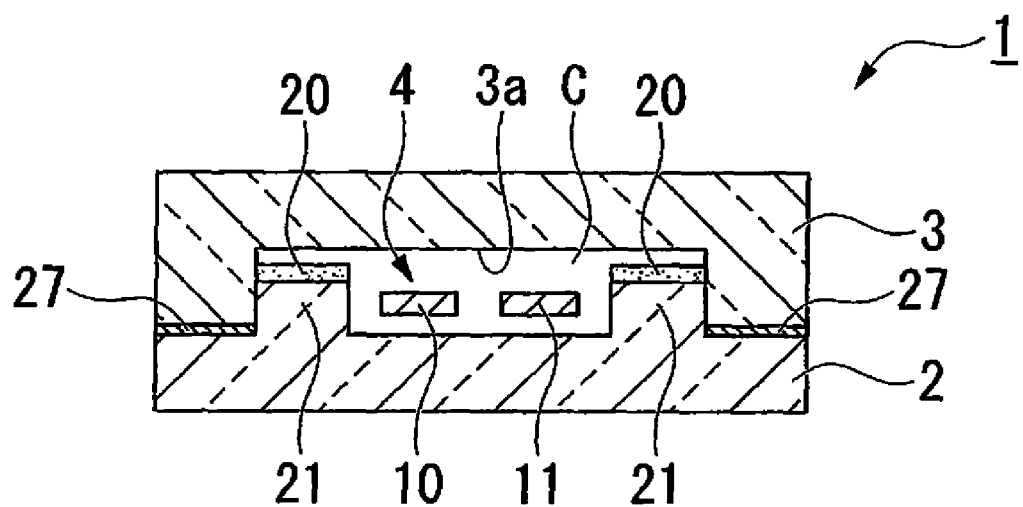
FIG. 20 is a cross-sectional view showing another modified example of the piezoelectric vibrator of the invention.
Figure 21:
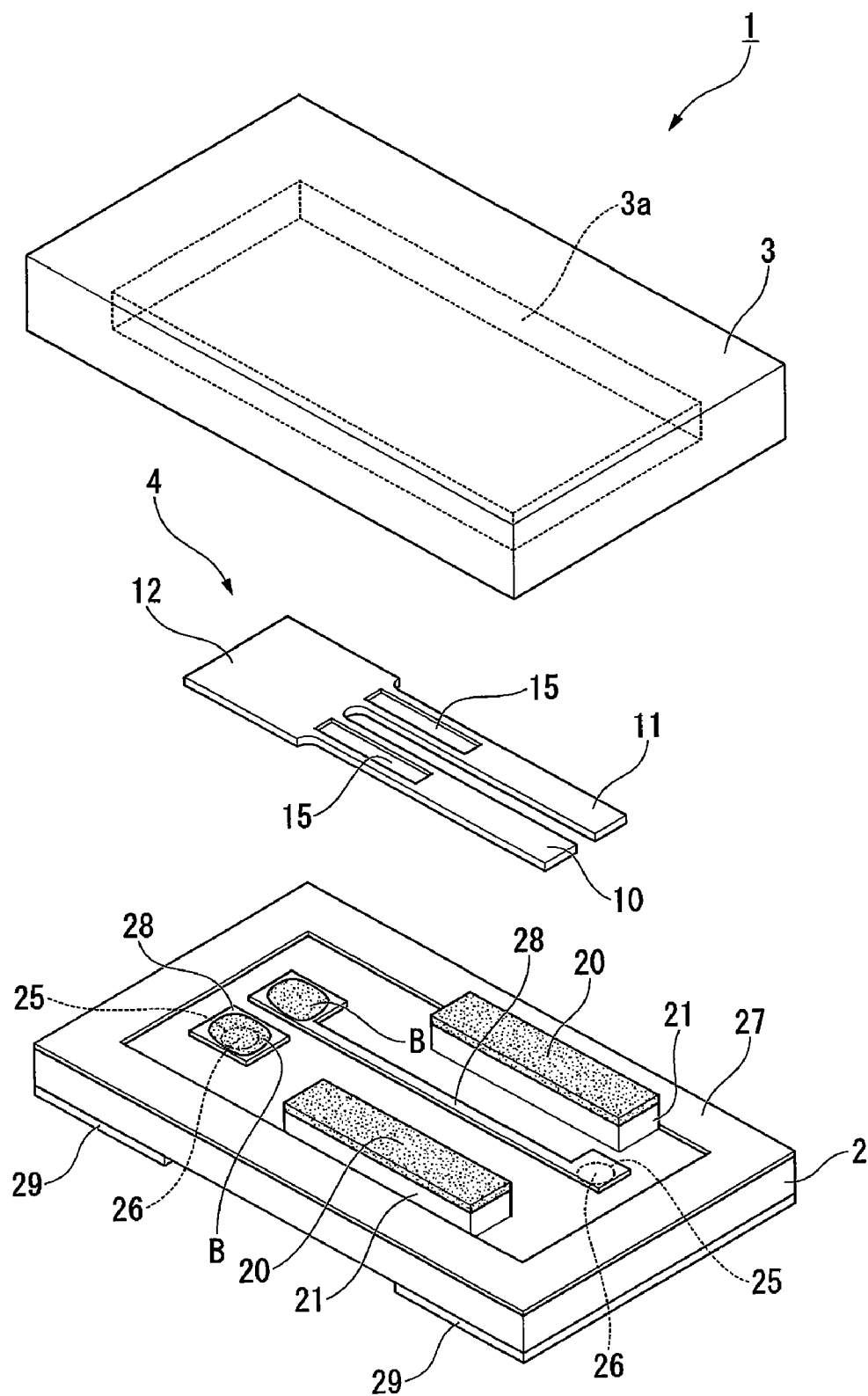
FIG. 21 is an exploded perspective view of the piezoelectric vibrator shown in FIG. 20.

Furthermore, as shown in FIGS. 20 and 21, the restriction portion 21 may be formed on the base substrate 2 side but not the lid substrate 3 and the getter material 20 may be formed on the restriction portion 21. Even in this case, the same working effect can be obtained. Even in this case, the getter material 20 may be formed on the lid substrate 3 side.

Furthermore, in the above-mentioned embodiments, as an example of the piezoelectric vibrating reed 4, the piezoelectric vibrating reed 4 with grooves in which the groove portions 15 are formed on both surfaces of the vibration arm portions 10 and 11 is described, but it may be a type of piezoelectric vibrating reed without the groove portions 15. However, by forming the grove portions 15, when a predetermined voltage is applied to the pair of excitation electrodes 13, the electric field efficiency between the pair of excitation electrodes 13 can be improved, which can further suppress the vibration loss and further improve the vibration property. That is, the CI value (Crystal Impedance) can be further reduced and the high performance of the piezoelectric vibrating reed 4 can be further promoted. Given this point, it is desirable to form the groove portions 15.

Furthermore, while in the above-mentioned embodiments the base substrate 2 and the lid substrate 3 are anode-bonded via the bonding film 27, the invention is not limited to anode-bonding. However, anode-bonding is desirable in that both substrates 2 and 3 can be strongly bonded by the anode-bonding.

Moreover, while in the above-mentioned embodiment the piezoelectric vibrating reed 4 is bump-bonded, it is not limited to bump-bonding. For example, the piezoelectric vibrating reed 4 may be bonded by a conductive adhesive. However, the piezoelectric vibrating reed 4 can float from the upper surface of the base substrate 2 by bump-bonding, whereby it is possible to naturally secure the minimum vibration gap that is necessary for the vibration. Thus, the bump-bonding is desirable in this point.

What is claimed is:
1. A piezoelectric vibrator including:
a base substrate and a lid substrate which are bonded to each other with a cavity formed therebetween;
a piezoelectric vibrating reed which has a pair of vibration arm portions extending in parallel and is mounted on the base substrate within the cavity; and
a getter material of a metallic film that is formed on the base substrate or the lid substrate so as to be arranged within the cavity and improve a degree of vacuum within the cavity by being heated, and
a restriction portion, arranged in the cavity and restricting a scattering direction of the getter material evaporated by the heating to suppress a scattering amount scattering toward the vibration arm portion, the restriction portion being formed in the base substrate or the lid substrate.
2. The piezoelectric vibrator according to claim 1,
wherein the restriction portion protrudes from one substrate of the base substrate and the lid substrate toward the other substrate thereof and is formed in one substrate side in the shape of a wall so as to extend along the vibration arm portion in the state of being separated from a side wall of the cavity, and
wherein the getter material is formed in the one substrate side so as to be arranged between the restriction portion and the side wall in a length shorter than that of the restriction portion.

3. The piezoelectric vibrator according to claim 1, wherein the restriction portion protrudes from one substrate of the base substrate and the lid substrate toward the other substrate thereof, and is formed in the one substrate side so as to extend along the vibration arm portion, and wherein the getter material is formed on the restriction portion or on the other substrate in the state of being accommodated in a gap between the restriction portion and the other substrate facing each other.

4. An oscillator in which the piezoelectric vibrator according to claim 1 is electrically connected to an integrated circuit as an oscillating element.

5. Electronic equipment in which the piezoelectric vibrator according to claim 1 is electrically connected to a measurement portion.

6. A radio-controlled timepiece in which the piezoelectric vibrator according to claim 1 is electrically connected to a filter portion.

* * * * *